(12) United States Patent
Kim et al.

(10) Patent No.: US 7,388,226 B2
(45) Date of Patent: Jun. 17, 2008

(54) LIQUID CRYSTAL DISPLAY OF HORIZONTAL ELECTRONIC FIELD APPLYING TYPE AND FABRICATED METHOD THEREOF

(75) Inventors: Woong Kwon Kim, Gunpo-shi (KR); Young Gyoung Chang, Uiwang-shi (KR); Heung Lyul Cho, Suwon-shi (KR)

(73) Assignee: LG. Philips LCD. Co., Ltd, Seoul (KR)

( * ) Notice: Subject to any disclaimer, the term of this patent is extended or adjusted under 35 U.S.C. 154(b) by 81 days.

(21) Appl. No.: 10/963,219

(22) Filed: Oct. 12, 2004

(65) Prior Publication Data
US 2005/0093029 A1    May 5, 2005

(30) Foreign Application Priority Data
Nov. 4, 2003   (KR) ............... 10-2003-0077657

(51) Int. Cl.
*G02F 1/136*  (2006.01)
(52) U.S. Cl. ................... 257/72; 257/59; 349/42; 349/141
(58) Field of Classification Search ............ 257/66, 257/72, 59; 349/42, 141, 138
See application file for complete search history.

(56) References Cited

U.S. PATENT DOCUMENTS

| | | | |
|---|---|---|---|
| 6,177,970 B1* | 1/2001 | Kim | 349/43 |
| 6,486,933 B1* | 11/2002 | Cha et al. | 349/139 |
| 6,765,270 B2* | 7/2004 | Chae | 257/390 |
| 6,924,864 B2* | 8/2005 | Kim | 349/141 |
| 2001/0013915 A1* | 8/2001 | Song | 349/141 |
| 2002/0008798 A1* | 1/2002 | Song et al. | 349/43 |
| 2002/0191138 A1* | 12/2002 | Matsumoto et al. | 349/141 |
| 2003/0123009 A1* | 7/2003 | Jo et al. | 349/141 |
| 2004/0263751 A1* | 12/2004 | Kim et al. | 349/141 |
| 2005/0079657 A1* | 4/2005 | Yoo et al. | 438/151 |

FOREIGN PATENT DOCUMENTS

| | | |
|---|---|---|
| KR | 2003-0033515 | 6/2000 |
| KR | 2003-0082647 | 10/2003 |

OTHER PUBLICATIONS

Office Action dated Aug. 17, 2005 corresponding to Korean Patent Application No. 10-2003-77657.
Office Action dated Oct. 27, 2006 for corresponding Chinese Patent Application No. 200410085644.1.

* cited by examiner

*Primary Examiner*—Phat X. Cao
*Assistant Examiner*—Abul Kalam
(74) *Attorney, Agent, or Firm*—Brinks Hofer Gilson & Lione

(57) ABSTRACT

A three-mask horizontal electric field applying type thin film transistor substrate is disclosed in which three conductive layers are formed. The first conductive layer contains a parallel gate and common lines and gate and common electrodes. A semiconductor pattern is formed on a gate insulating film coating the structure. The second conductive layer forms a data line, a source electrode connected to the data line and a drain electrode opposed to the source electrode on the semiconductor pattern. A protective film is coated thereon. The protective film and the gate insulating film are patterned to expose a portion of the drain electrode and a pixel hole. A third conductive layer is patterned to provide a pixel electrode connected to the exposed drain electrode and making an interface with the protective film within the pixel hole.

11 Claims, 22 Drawing Sheets

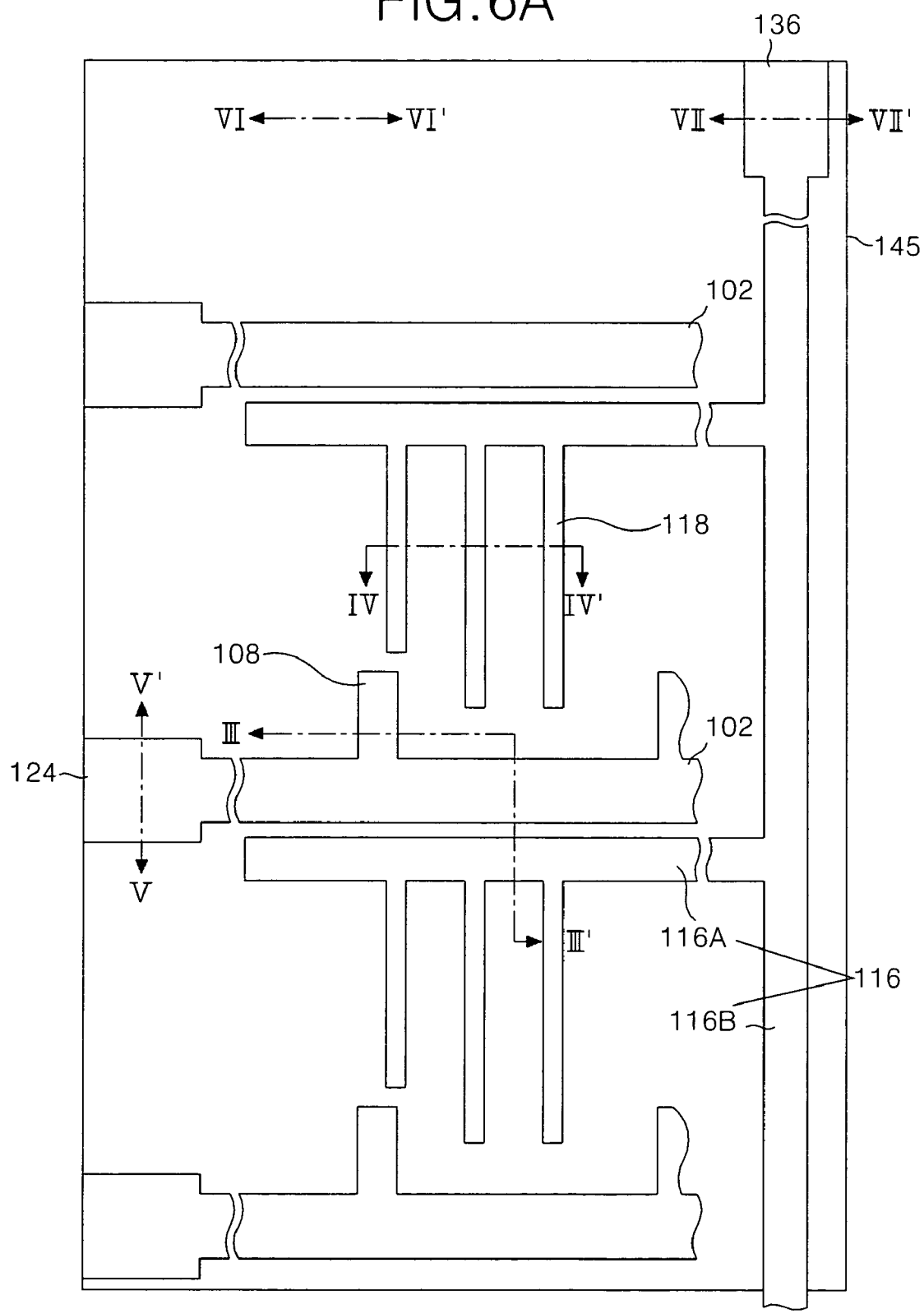

LIQUID CRYSTAL DISPLAY OF HORIZONTAL ELECTRONIC FIELD APPLYING TYPE AND FABRICATED METHOD THEREOF

This application claims the benefit of the Korea Patent Application No. 2003-77657 filed on Nov. 4, 2003, which is hereby incorporated by reference.

BACKGROUND

1. Field

The present invention relates to a liquid crystal display, and more particularly to a thin film transistor substrate of horizontal electric field applying type and a fabricating method thereof that are capable of simplifying processing by using fewer mask processes as well as improving lift-off ability.

2. Description of the Related Art

Generally, a liquid crystal display (LCD) controls light transmittance of liquid crystal disposed therein using an electric field to thereby display a picture. The liquid crystal displays are largely classified into a vertical electric field type and a horizontal electric field type depending upon the direction of the electric field driving the liquid crystal.

The liquid crystal display of vertical electric field applying type drives a liquid crystal in a twisted nematic (TN) mode with a vertical electric field formed between a pixel electrode and a common electrode arranged in opposition to each other on the upper and lower substrate. The liquid crystal display of vertical electric field applying type has a large aperture ratio but also has a narrow viewing angle of about 90°.

The liquid crystal display of horizontal electric field applying type drives a liquid crystal in an in plane switch (IPS) mode with a horizontal electric field between the pixel electrode and the common electrode arranged in parallel to each other on the lower substrate. The liquid crystal display of horizontal electric field applying type has a wide viewing angle of about 160°.

Hereinafter, the liquid crystal display of horizontal electric field applying type will be described in detail.

The liquid crystal display of the horizontal electric field applying type includes a thin film transistor substrate (i.e., a lower substrate) and a color filter substrate (i.e., an upper substrate) joined in opposition to each other, a spacer for uniformly maintaining a cell gap between two substrates, and a liquid crystal filled into the cell gap.

The thin film transistor array substrate is comprised of a plurality of signal wirings for forming a horizontal electric field for each pixel, a plurality of thin film transistors, and an alignment film coated thereon to align the liquid crystal. The color filter substrate includes a color filter for implementing different colors, a black matrix for preventing light leakage and an alignment film coated thereon to align the liquid crystal.

In such a liquid crystal display, the thin film transistor substrate has a complicated fabrication process. This leads to a major rise in the manufacturing costs of the liquid crystal display panel because it involves both semiconductor processes and a plurality of mask processes. Prior thin film transistor substrates have been developed to reduce the number of mask processes. This is because each mask process includes a number of processes such as thin film deposition, cleaning, photolithography, etching, photo-resist stripping and inspection, etc. Although conventional thin film transistor substrates use five mask processes, recently, a thin film transistor substrate using a four-mask process has been introduced.

FIG. 1 is a plan view showing a structure of a thin film transistor substrate of horizontal electric applying type adopting the conventional four-mask process, and FIG. 2 is a section view of the thin film transistor substrate taken along the I-I' and II-II' line in FIG. 1.

Referring to FIG. 1 and FIG. 2, the thin film transistor substrate includes a gate line 2 and intersecting a data line 4 provided on a lower substrate 45 with a gate insulating film 46 therebetween, a thin film transistor 6 provided at each intersection, a pixel electrode 14 and a common electrode 18 provided at a pixel area defined by the intersection to form a horizontal field, and a common line 16 connected to the common electrode 18. Further, the thin film transistor substrate includes a storage capacitor 20 provided at an overlapped portion between the pixel electrode 14 and the common line 16, a gate pad 24 connected to the gate line 2, and a data pad 30 connected to the data line 4 and a common pad 36 connected to the common line 16.

The gate line 2 supplied with a gate signal and the data line 4 supplied with a data signal are provided at the intersection to defined a pixel area.

The common line 16 supplied with a reference voltage for driving the liquid crystal is provided parallel to the gate line 2 with the pixel area therebetween.

The thin film transistor 6 allows the pixel signal of the data line 4 to be charged and maintained in the pixel electrode 14 in response to the gate signal of the gate line 2. To this end, the thin film transistor 6 includes a gate electrode 8 connected to the gate line 2, a source electrode 10 connected to the data line 4, and a drain electrode 12 connected to the pixel electrode 14. Further, the thin film transistor 6 includes an active layer 48 overlapping with the gate electrode 8 with a gate insulating film 46 therebetween to define a channel between the source electrode 10 and the drain electrode 12.

The active layer 48 also overlaps with the data line 4, a lower data pad electrode 32 and an upper storage electrode 22. On the active layer 48, an ohmic contact layer 50 for making ohmic contact with the data line 4, the source electrode 10, the drain electrode 12, and the lower data pad electrode 32 is further provided.

The pixel electrode 14 is connected, via a first contact hole 13 going through a protective film 52, to the drain electrode 12 of the thin film transistor 6 and is provided at the pixel area. Particularly, the pixel electrode 14 includes a first horizontal part 14A connected to the drain electrode 12 and provided in parallel with adjacent gate lines 2, a second horizontal part 14B overlapping with the common line 16, and a finger part 14C provided in parallel between the first and second horizontal parts 14A and 14B.

The common electrode 18 is connected to the common line 16 and is provided in the pixel area. Specifically, the common electrode 18 is provided in parallel with the finger part 14C of the pixel electrode 14 in the pixel area.

Accordingly, a horizontal electric field is formed between the pixel electrode 14, to which a pixel signal is supplied via the thin film transistor 6, and the common electrode 18, to which a reference voltage is supplied via the common line 16. Specifically, the horizontal electric field is formed between the finger part 14C of the pixel electrode 14 and the common electrode 18. Liquid crystal molecules arranged in the horizontal direction between the thin film transistor substrate and the color filter substrate are rotated due to dielectric anisotropy by the horizontal electric field. Transmittance of light through the pixel area depends upon the extent of rotation of the liquid crystal molecules, thereby implementing a gray level scale.

The storage capacitor 20 consists of the common line 16, an upper storage electrode 22 overlapping the common line 16 with the gate insulating film 46, the active layer 48 and the ohmic contact layer 50 therebetween, and a pixel electrode 14 connected, via a second contact hole 21 provided at the protective film 52, to the upper storage electrode 22. The storage capacitor 20 allows a pixel signal charged in the pixel electrode 14 to be stably maintained until the next pixel signal is charged.

The gate line 2 is connected, via the gate pad 24, to a gate driver (not shown). The gate pad 24 consists of a lower gate pad electrode 26 extended from the gate line 2, and an upper gate pad electrode 28 connected, via a third contact hole 27 going through the gate insulating film 46 and the protective film 52, to the lower gate pad electrode 26.

The data line 4 is connected, via the data pad 30, to the data driver (not shown). The data pad 30 consists of a lower data pad electrode 32 extended from the data line 4, and an upper data pad electrode 34 connected, via a fourth contact hole 33 going through the protective film 52, to the lower data pad electrode 32.

The common line 16 receives a reference voltage from an external reference voltage source (not shown) through the common pad 36. The common pad 36 consists of a lower common pad electrode 38 extended from the common line 16, and an upper common pad electrode 40 connected, via a fifth contact hole 39 going through the gate insulating film 46 and the protective film 52, to the lower common pad electrode 38.

A method of fabricating the thin film transistor substrate having the above-mentioned structure using the four mask process procedure will be described in detail with reference to FIGS. 3A to 3D.

Referring to FIG. 3A, a gate metal pattern group including the gate line 2, the gate electrode 8 and the lower gate pad electrode 26, the common line 16, the common electrode 18 and the lower common pad electrode 38 is provided on the lower substrate 45 by the first mask process.

More specifically, a gate metal layer is formed on the upper substrate 45 by a deposition technique such as sputtering. Then, the gate metal layer is patterned by photolithography and the etching process using a first mask to thereby form the gate metal pattern group including the gate line 2, the gate electrode 8, the lower gate pad electrode 26, the common line 16, common electrode 18 and the lower common pad electrode 38. Herein, the gate metal layer is formed from a metal such as aluminum-group metal, chrome (Cr) or molybdenum (Mo).

Referring to FIG. 3B, the gate insulating film 46 is coated onto the lower substrate 45 provided with the gate metal pattern group. Further, a semiconductor pattern including the active layer 48 and the ohmic contact layer 50 and a source/drain metal pattern group including the data line 4, the source electrode 10, the drain electrode 12, the lower data pad electrode 32 and the upper storage electrode 22 are provided on the gate insulating film 46 by the second mask process.

More specifically, the gate insulating film 46, an amorphous silicon layer, a $n^+$ amorphous silicon layer and a source/drain metal layer are sequentially provided on the lower substrate 45 provided with the gate metal pattern group by deposition techniques such as plasma enhanced chemical vapor deposition (PECVD) and sputtering, etc. Herein, the gate insulating film 44 is formed from an inorganic insulating material such as silicon nitride ($SiN_x$) or silicon oxide ($SiO_x$). The source/drain metal is made from molybdenum (Mo), titanium (Ti), tantalum (Ta) or a molybdenum alloy, etc.

Then, a photo-resist pattern is formed on the source/drain metal layer by photolithography using a second mask. In this case, a diffractive exposure mask having a diffractive exposing part at a channel portion of the thin film transistor is used as a second mask, thereby allowing the photo-resist pattern of the channel portion to have a lower height than the other source/drain pattern portion.

Subsequently, the source/drain metal layer is patterned by wet etching using the photo-resist pattern to thereby provide the source/drain metal pattern group including the data line 4, the source electrode 10, the drain electrode 12 being integral to the source electrode 10 and the upper storage electrode 22.

Next, the $n^+$ amorphous silicon layer and the amorphous silicon layer are patterned at the same time by dry etching using the same photo-resist pattern to thereby provide the ohmic contact layer 50 and the active layer 48.

The photo-resist pattern having a relatively low height is removed from the channel portion by ashing and thereafter the source/drain metal pattern and the ohmic contact layer 50 of the channel portion are etched by dry etching. Thus, the active layer 48 of the channel portion is exposed to disconnect the source electrode 10 from the drain electrode 12.

Then, the photo-resist pattern left on the source/drain metal pattern group is removed by stripping.

Referring to FIG. 3C, the protective film 52 including the first to fifth contact holes 13, 21, 27, 33 and 39 are formed on the gate insulating film 46 provided with the source/drain metal pattern group by the third mask process.

More specifically, the protective film 52 is entirely provided on the gate insulating film 46 provided with the source/drain metal pattern group by a deposition technique such as PECVD. The protective film 52 is patterned by photolithography and etching using the third mask to thereby define the first to fifth contact holes 13, 21, 27, 33 and 39. The first contact hole 13 passes through the protective film 52 to expose the drain electrode 12, whereas the second contact hole 21 passes through the protective film 52 to expose the upper storage electrode 22. The third contact hole 27 passes through the protective film 52 and the gate insulating film 46 to expose the lower gate pad electrode 26. The fourth contact hole 32 passes through the protective film 52 to expose the lower data pad electrode 32. The fifth contact hole 30 passes through the protective film 52 and the gate insulating film 46 to expose the lower common pad electrode 38. Herein, if the source/drain metal is formed from a metal having a large dry-etching ratio such as molybdenum (Mo), then each of the first, second and fourth contact holes 13, 21 and 33 passes through the drain electrode 12, the upper storage electrode 22 and the lower data pad electrode 32 to thereby expose the side surfaces thereof.

The protective film 50 is formed from an inorganic material identical to the gate insulating film 46, or an organic material having a small dielectric constant such as an acrylic organic compound, BCB (benzocyclobutene) or PFCB (perfluorocyclobutane), etc.

Referring to FIG. 3D, a transparent conductive film pattern group including the pixel electrode 14, the upper gate pad electrode 28, the upper data pad electrode 34 and the upper common pad electrode 40 are provided on the protective film 52 by the fourth mask process.

More specifically, a transparent conductive film is coated onto the protective film 52 by a deposition technique such as sputtering, etc. Then, the transparent conductive film is patterned by photolithography and etching using a fourth mask to thereby provide the transparent conductive pattern group including the pixel electrode 14, the upper gate pad electrode 28, the upper data pad electrode 34 and the upper common pad electrode 40. The pixel electrode 14 is electrically connected, via the first contact hole 13, to the drain electrode 12 while being electrically connected, via the second contact hole 21, to the upper storage electrode 22. The upper gate pad electrode 28 is electrically connected, via the third contact hole 37, to the lower gate pad electrode 26. The upper data pad electrode 34 is electrically connected, via the fourth contact hole 33, to the lower data pad electrode 32. The upper common pad electrode 40 is electrically connected, via the fifth contact hole 39, to the lower common pad electrode 38.

Herein, the transparent conductive film is formed from indium-tin-oxide (ITO), tin-oxide (TO) or indium-zinc-oxide (IZO), etc.

The conventional thin film transistor substrate of horizontal electric field applying type and the fabricating method thereof as mentioned above uses four mask processes. However, since a technique using four mask processes remains complicated, the amount of cost reduction remains limited.

SUMMARY

A thin film transistor substrate according to one aspect of the present invention includes a gate line and a common line arranged in parallel to each other and formed on a substrate by a first conductive layer; a data line crossing the gate line and the common line and having a gate insulating film therebetween to define a pixel area and formed by a second conductive layer; a thin film transistor connected to the gate line and the data line; a semiconductor pattern including the thin film transistor and overlapping the data line; a common electrode extending from the common line into the pixel area and formed by the first conductive layer; a protective film covering the plurality of signal (data, gate, and/or common) lines and electrodes and the thin film transistor; and a pixel electrode connected to the thin film transistor and contacting the protective film within a pixel hole passing through the protective film and the gate insulating film at the pixel area to form a horizontal electric field along with the common electrode, the pixel electrode being formed by a third conductive layer.

The thin film transistor substrate of the first aspect further includes a lower gate pad electrode extending from the gate line; a first contact hole passing through the protective film and the gate insulating film to expose the lower gate pad electrode; and a gate pad contacting the protective film within the first contact hole and having an upper gate pad electrode formed by the third conductive layer.

The thin film transistor substrate further includes a lower common pad electrode extending from the common line; a second contact hole passing through the protective film and the gate insulating film to expose the lower common pad electrode; and a common pad contacting the protective film within the second contact hole and having an upper common pad electrode formed by the third conductive layer.

The thin film transistor substrate further includes a lower data pad electrode extending from the data line; a third contact hole passing through the protective film to expose the lower data pad electrode; and a data pad contacting the protective film within the third contact hole and having an upper data pad electrode formed by the third conductive layer, wherein the semiconductor pattern overlaps with the lower data pad electrode.

The thin film transistor substrate further includes a first lower storage electrode included in the gate line; a second lower storage electrode included in the common line adjacent to the gate line; and a storage capacitor connected to the pixel electrode and having an upper storage electrode provided with the gate insulating film intervening between the storage capacitor and the first and second lower storage electrodes, wherein the semiconductor pattern overlaps with the upper storage electrode.

Herein, the pixel electrode is connected to a portion of a drain electrode of the thin film transistor exposed by the pixel hole and a portion of the upper storage electrode.

A method of fabricating a thin film transistor substrate, according to another aspect of the present invention, includes forming a gate line and a gate electrode connected to the gate line on a substrate by a first conductive layer; forming a common line parallel to the gate line and a common electrode extending from the common line into a pixel area by the first conductive layer; coating a gate insulating film on the entire surface of the substrate including the first conductive layer; forming a semiconductor pattern in a desired area of the gate insulating film; forming a data line crossing the gate line and the common line, a source electrode connected to the data line and a drain electrode opposed to the source electrode on the semiconductor pattern by a second conductive layer; coating a protective film on the entire surface of the substrate including the second conductive layer; patterning the protective film and the gate insulating film to expose a portion of the drain electrode and to provid a pixel hole in which a pixel electrode for forming a horizontal electric field along with the common electrode is to be formed at the pixel area; and patterning a third conductive layer to provide a pixel electrode connected to the exposed drain electrode and contacting the protective film within the pixel hole.

In the method, patterning the protective film and the gate insulating film includes forming a photo-resist pattern on the protective film using a mask; and etching the protective film exposed through the photo-resist pattern and the gate insulating film.

Patterning the third conductive layer includes forming the third conductive layer on the photo-resist pattern left on the patterned protective film; and removing the photo-resist pattern covered with the third conductive layer.

The method further includes forming a lower gate pad electrode extending from the gate line by the first conductive layer; forming a first contact hole passing through the protective film and the gate insulating film to expose the lower gate pad electrode; and forming an upper gate pad electrode contacting the protective film within the first contact hole by the third conductive layer.

The method further includes forming a lower common pad electrode extending from the common line by the first conductive layer; forming a second contact hole passing through the protective film and the gate insulating film to expose the lower common pad electrode; and forming an upper common pad electrode contacting the protective film within the second contact hole by the third conductive layer.

The method further includes forming a lower data pad electrode extending from the data line while overlapping the semiconductor pattern by the second conductive layer; forming a third contact hole passing through the protective film to expose the lower data pad electrode; and forming an upper data pad electrode contacting the protective film within the third contact hole by the third conductive layer.

The method further includes forming an upper storage electrode overlapping a portion of the gate line and a portion of the common line adjacent to the gate line with having the gate insulating film and the semiconductor pattern therebetween and connected to the pixel electrode by the second conductive layer.

A method of fabricating a thin film transistor substrate according to still another aspect of the present invention includes a first mask process of forming a gate line, a gate electrode connected to the gate line, a common line parallel to the gate line and a common electrode extending from the common line into a pixel area on a substrate by a first conductive layer; a second mask process of coating the gate insulating film on the entire surface of the substrate including the first conductive layer, forming a semiconductor pattern in a desired area of the gate insulating film, and forming a data line crossing the gate line and the common line, a source electrode connected to the data line and a drain electrode opposed to the source electrode on the semiconductor pattern by a second conductive layer; and a third mask process of coating the protective film on the entire surface of the substrate including the second conductive layer, patterning the protective film along with the gate insulating film to, define a pixel hole, and forming a pixel electrode connected to the drain electrode within the pixel hole and contacting the protective film by a third conductive layer, the pixel electrode forming a horizontal electric field along with the common electrode.

In the method, the third mask process includes coating the protective film; forming a photo-resist pattern on the protective film using a mask; patterning the protective film exposed through the photo-resist pattern and the gate insulating film; forming a third conductive layer on the photo-resist pattern left on the patterned protective film; and removing the photo-resist pattern covered with the third conductive layer to pattern the third conductive layer.

The first mask process further includes forming a lower gate pad electrode extending from the gate line by a first conductive layer, and the third mask process further includes forming a first contact hole passing through the protective film and the gate insulating film to expose the lower gate pad electrode and forming an upper gate pad electrode contacting the protective film within the first contact hole by the third conductive layer.

The first mask process further includes forming a lower common pad electrode extending from the common line by the first conductive layer, and the third mask process further includes forming a second contact hole passing through the protective film and the gate insulating film to expose the lower common pad electrode and forming an upper common pad electrode contacting the protective film within the second contact hole by the third conductive layer.

The second mask process further includes forming a lower data pad electrode extending from the data line while overlapping the semiconductor pattern by the second conductive layer, and the third mask process further includes forming a third contact hole passing through the protective film to expose the lower data pad electrode and forming an upper data pad electrode contacting the protective film within the third contact hole by the third conductive layer.

The second mask process further includes forming an upper storage electrode overlapping a portion of the gate line and a portion of the common line adjacent to the gate line with the gate insulating film and the semiconductor pattern therebetween and connected to the pixel electrode by the second conductive layer.

In the method, the upper storage electrode protrudes toward the pixel electrode to be exposed by the pixel hole, thereby being connected to the pixel electrode.

Herein, the third conductive layer contains at least one of a transparent conductive material, titanium and tungsten.

Herein, the pixel hole and the first, second and/or third contact holes permit a stripper to penetrate therethrough and remove a photo-resist pattern used upon patterning of the protective film.

BRIEF DESCRIPTION OF THE DRAWINGS

The following detailed description of the embodiments of the present invention reference the accompanying drawings, in which:

FIG. 6A and FIG. 6B are a plan view and a section view for explaining a first mask process in a fabricating method of the thin film transistor substrate according to the embodiment of the present invention, respectively;

DETAILED DESCRIPTION

Reference will now be made in detail to the preferred embodiments of the present invention, examples of which are illustrated in the accompanying drawing.

Hereinafter, the preferred embodiments of the present invention will be described in detail with reference to FIGS. 4 to 10D.

Figure 1:
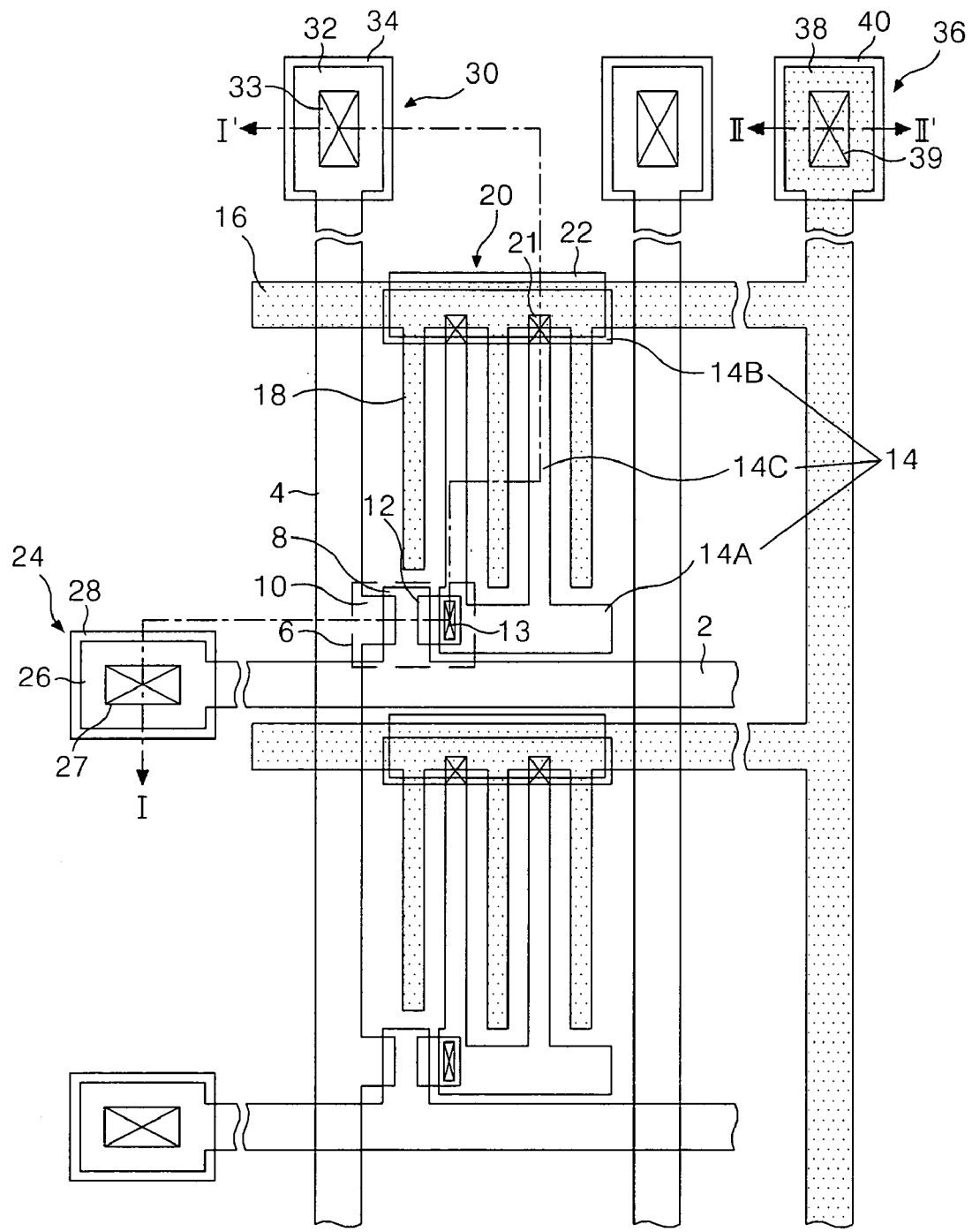
FIG. 1 is a plan view showing a structure of a conventional thin film transistor substrate of horizontal electric field applying type.
Figure 2:
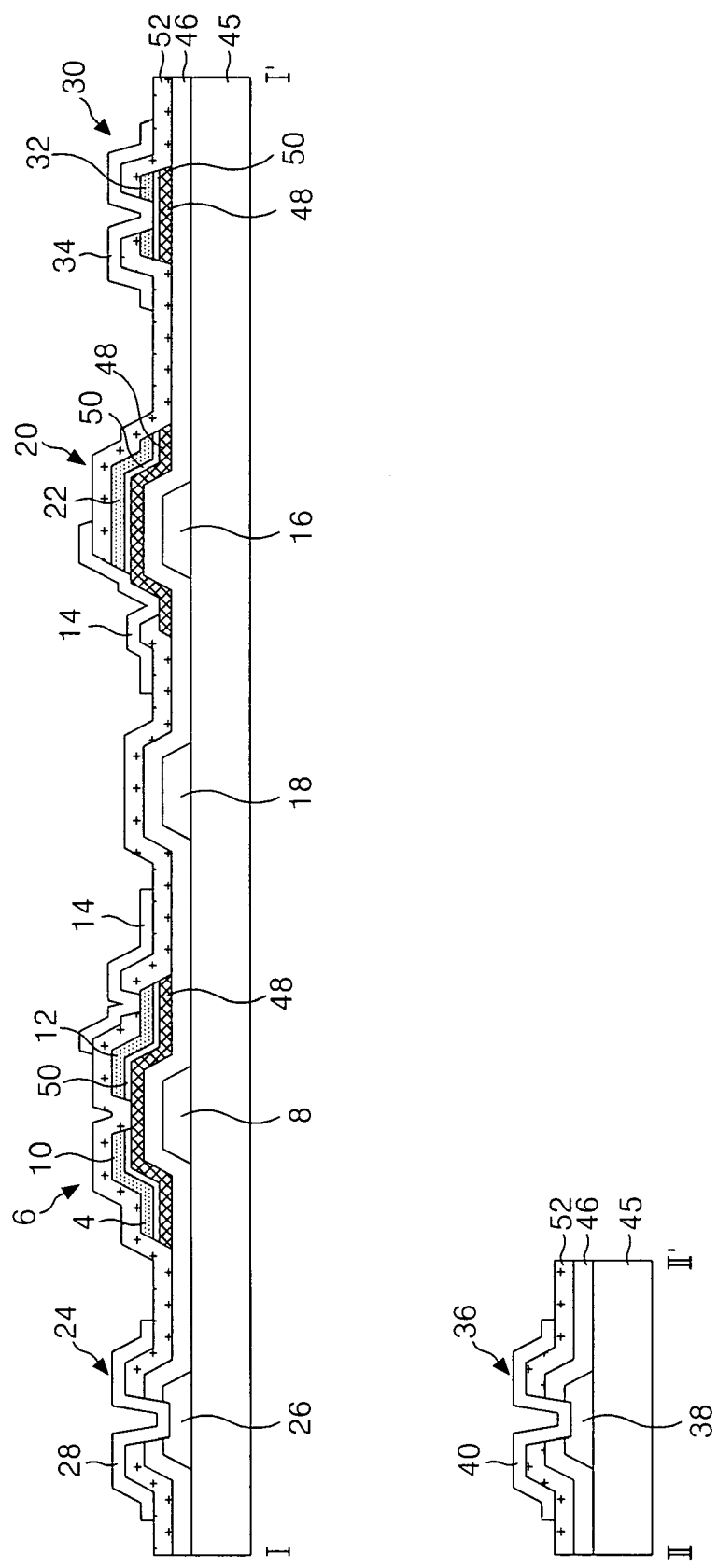
FIG. 2 is a section view of the thin film transistor substrate taken along the lines I-I' and II-II" in FIG. 1.
Figure 3A:
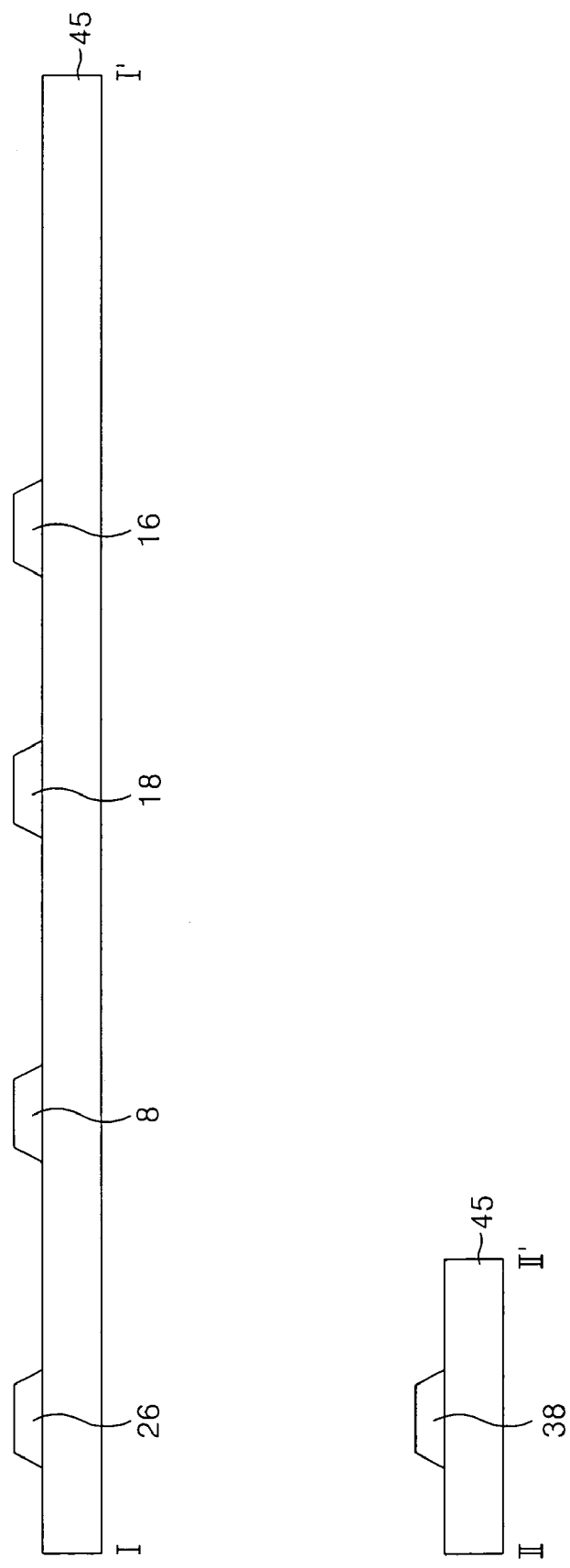
FIGS. 3A to 3D are section views illustrating a method of fabricating the thin film transistor substrate shown in FIG. 2 step by step.
Figure 3B:
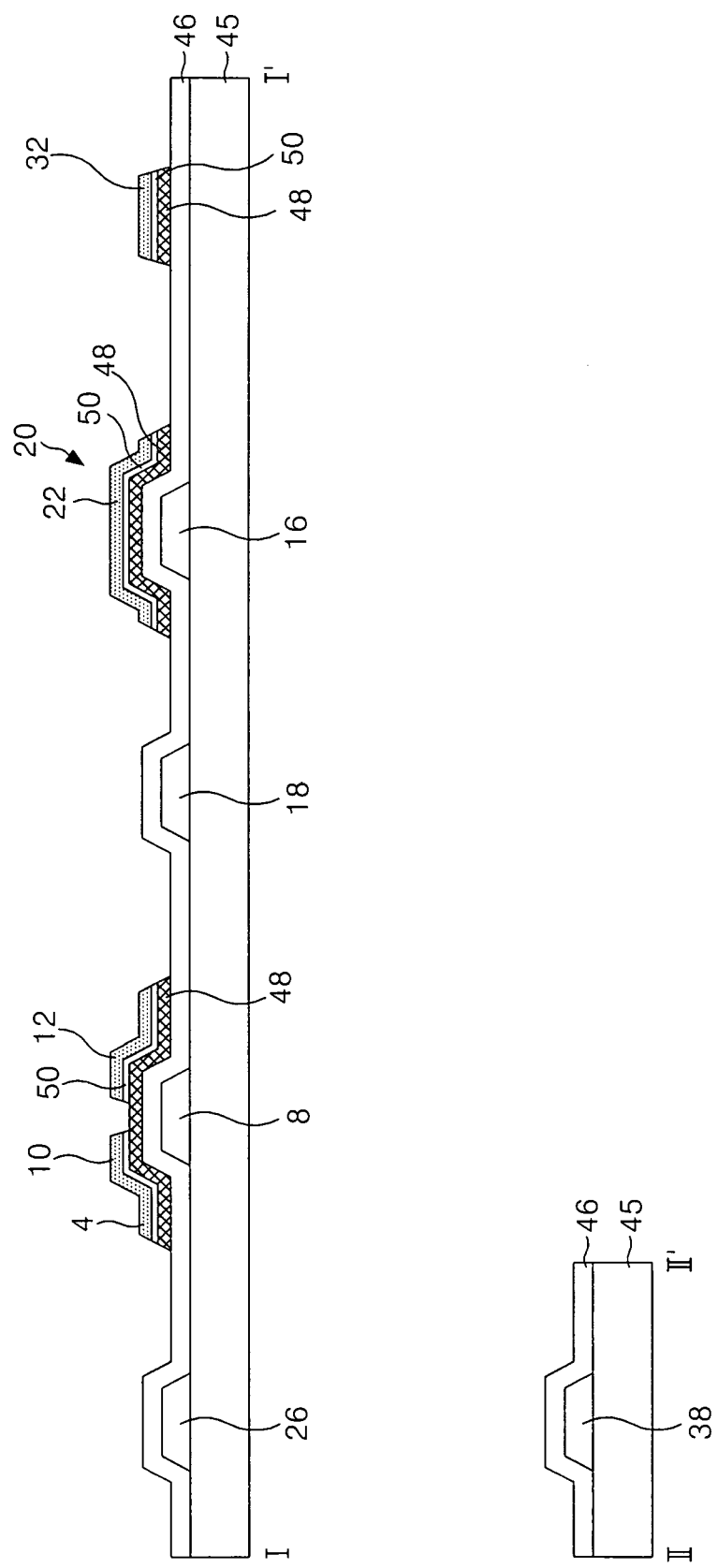
Figure 3C:
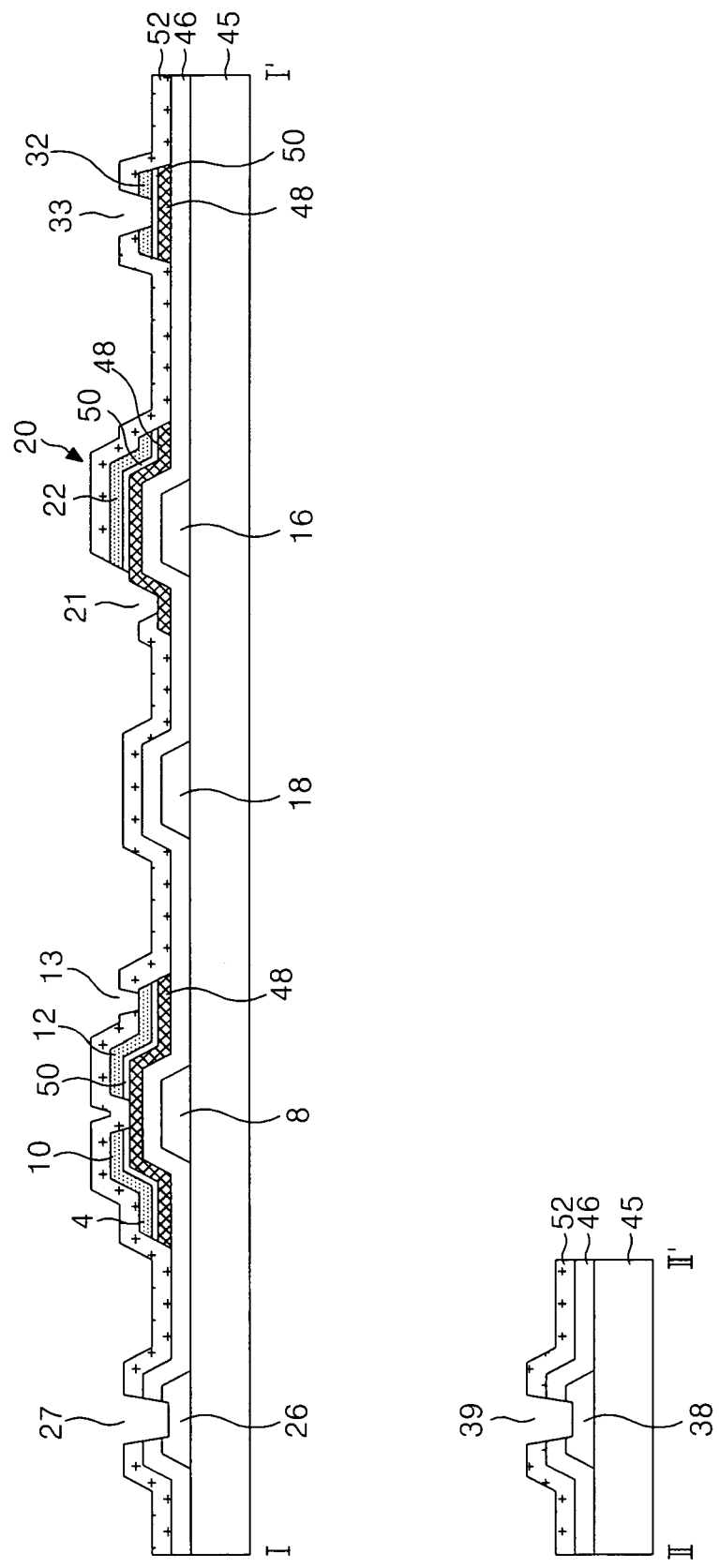
Figure 3D:
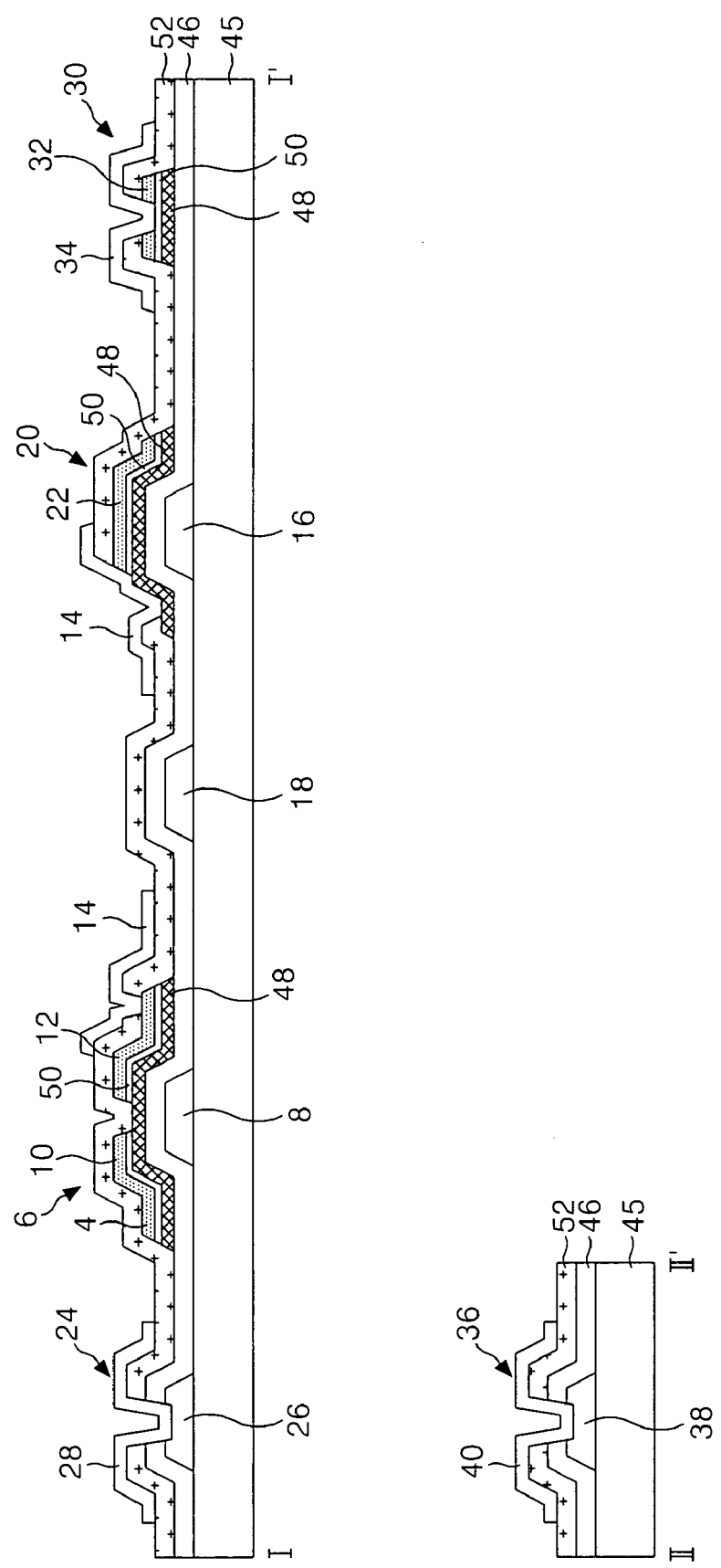
Figure 4:
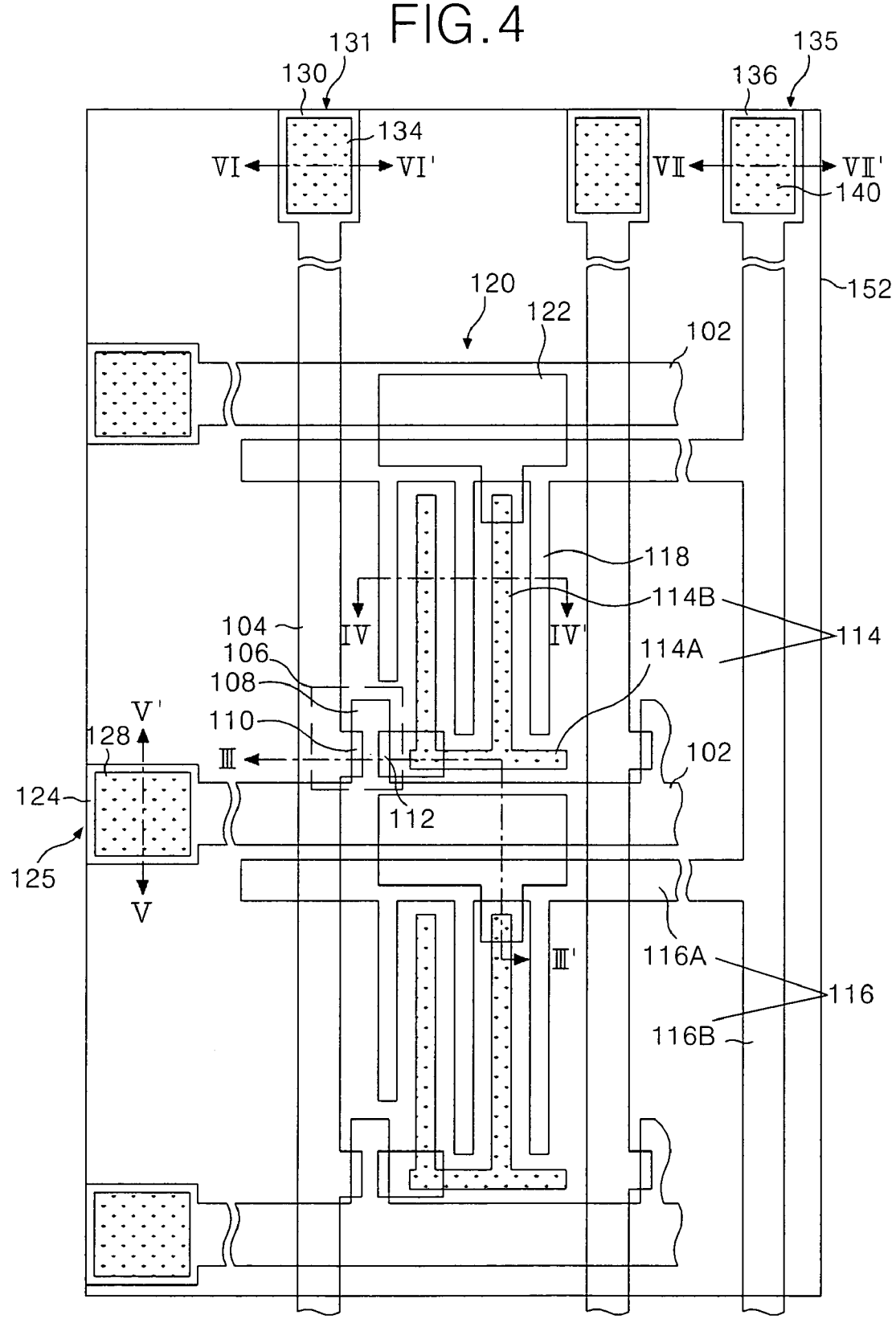
FIG. 4 is a plan view showing a structure of a thin film transistor substrate of horizontal electric field applying type according to an embodiment of the present invention.
Figure 5:
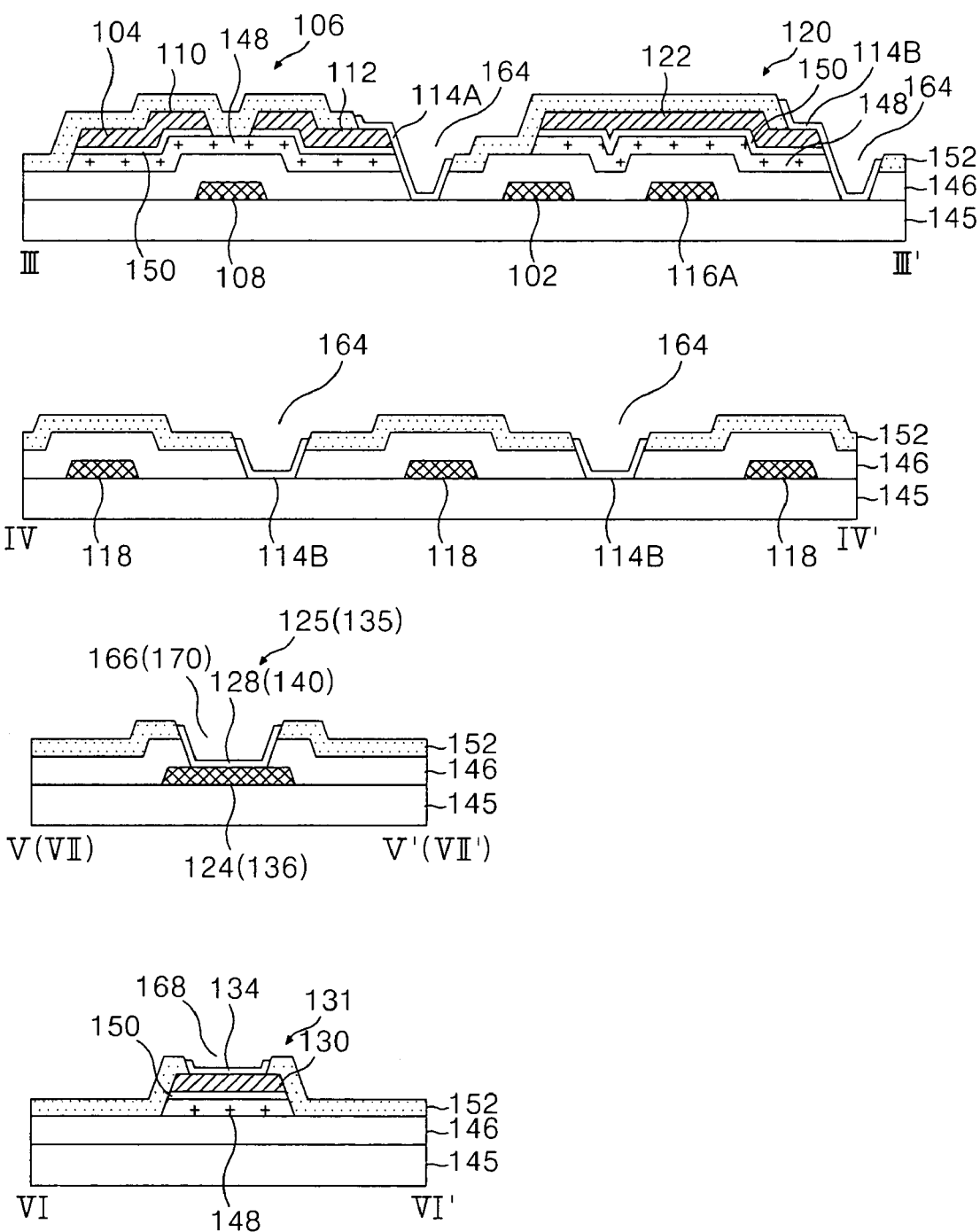
FIG. 5 is a section view of the thin film transistor substrate taken along the lines III-III', IV-IV', V-V, VI-VI and VII-VII in FIG. 1.

FIG. 4 is a plan view showing a structure of a thin film transistor substrate of horizontal electric field applying type according to an embodiment of the present invention, and FIG. 5 is a section view of the thin film transistor substrate taken along the lines III-III', IV-IV', V-V, VI-VI and VIII-VIII in FIG. 1.

Referring to FIG. 4 and FIG. 5, the thin film transistor substrate includes a gate line 102 and an intersecting data line 104 provided on a lower substrate 145 with a gate insulating film 146 therebetween, a thin film transistor 106 provided at each intersection, a pixel electrode 114 and a common electrode 118 provided in a pixel area defined by the intersection that form a horizontal field, and a common line 116 connected to the common electrode 118. Further, the thin film transistor substrate includes a storage capacitor 120 provided in an overlapped portion among the gate line 102, the common line 116 and an upper storage electrode 122, a gate pad 125 connected to the gate line 102, a data pad 131 connected to the data line 104, and a common pad 135 connected to the common line 116.

The gate line 102 supplied with a gate signal and the data line 104 supplied with a data signal are provided at the intersection to defined a pixel area. Herein, the gate line 102 is formed from a first conductive layer (i.e., a gate metal layer) while the data line 104 is formed from a second conductive layer (i.e., a source/drain metal layer).

The common line 116 and the common electrode 118 supply a reference voltage for driving the liquid crystal. The common line 116 contains an internal common line 116A provided in parallel to the gate line 102 in a display area, and an external common line 116B commonly connected to the internal common line 116A in a non-display area. The common electrode 118 has a finger shape and is extended from the internal common line 116A into the pixel area. The common line 116 and the common electrode 118 are formed into a first conductive layer along with the gate line 102.

The thin film transistor 106 allows the pixel signal of the data line 104 to be charged and maintained in the pixel electrode 114 in response to the gate signal of the gate line 102. To this end, the thin film transistor 106 includes a gate electrode 108 connected to the gate line 102, a source electrode 110 connected to the data line 104, a drain electrode 112 opposed to the source electrode 110, an active layer 148 overlapping the gate electrode 108 with a gate insulating film 146 therebetween to define a channel between the source electrode 110 and the drain electrode 112, and an ohmic contact layer 150 provided on the active layer 148 excluding the channel to make ohmic contact with the source electrode 110 and the drain electrode 112.

Further, the active layer 148 and the ohmic contact layer 150 overlap the data line 104, a lower data pad electrode 130 and an upper storage electrode 122 that are formed into a second conductive layer along with the source electrode 110 and the drain electrode 112.

The pixel electrode 114 forms a horizontal electric field, along with the common electrode 118, in the pixel area, and is connected to the drain electrode 112 of the thin film transistor 106. More specifically, the pixel electrode 114 contains a horizontal part 114A provided in parallel to the gate line 102 and connected to the drain electrode 112, and a finger part 114B extending from the horizontal part 114A into the pixel area to be in parallel to the common electrode 118. The pixel electrode 114 is formed into a third conductive layer (i.e., a transparent conductive layer or a Ti layer) within a pixel hole 164 passing through the protective layer 152 and the gate insulating film 146 in the pixel area. This eliminates step coverage between the pixel electrode 114 and the common electrode 118.

Further, the horizontal part 114A of the pixel electrode 114 is connected to a portion of the drain electrode 112 exposed by the pixel hole 164. As a result, a horizontal electric field is formed between the pixel electrode 114, to which a pixel signal is supplied via the thin film transistor 106, and the common electrode 118, to which a reference voltage is supplied via the common line 116. Specifically, the horizontal electric field is formed between the finger part 114B of the pixel electrode 114 and the common electrode 118. Liquid crystal molecules arranged in the horizontal direction between the thin film transistor substrate and the color filter substrate are rotated due to a dielectric anisotropy by such a horizontal electric field. Transmittance of light through the pixel area depends upon the extent of rotation of the liquid crystal molecules, thereby implementing a gray level scale.

The storage capacitor 120 includes a portion of the gate line responsible for a first lower storage electrode, a portion of the internal common line 116A responsible for a second lower storage electrode, and an upper storage electrode 122 overlapping the gate line 102 and the internal common line 116A with the gate insulating film 146, the active layer 148 and the ohmic contact layer 150 therebetween. Herein, the upper storage electrode 122 is formed into a second conductive layer along with the data line 104, the source electrode 110 and the drain electrode 112. Further, the upper storage electrode 122 protrudes toward the finger part 114B of the pixel electrode 114 to expose a portion thereof by the pixel hole 164, thereby being connected to the finger part 114B of the pixel electrode 114. The storage capacitor 120 allows a pixel signal charged in the pixel electrode 114 to be stably maintained until the next pixel signal is charged.

The gate line 102 is connected, via the gate pad 125, to a gate driver (not shown). The gate pad 125 contains a lower gate pad electrode 124 extending from the gate line 102, and an upper gate pad electrode 128 connected, via a first contact hole 166 going through the gate insulating film 146 and the protective film 152, to the lower gate pad electrode 124.

The common line 116 receives a reference voltage from an external reference voltage source (not shown) through the common pad 135. The common pad 135 includes a lower common pad electrode 136 extending from the common line 116, and an upper common pad electrode 140 connected, via a second contact hole 170 going through the gate insulating film 146 and the protective film 152, to the lower common pad electrode 136.

The data line 104 is connected, via the data pad 131, to the data driver (not shown). The data pad 131 includes a lower data pad electrode 130 extending from the data line 104, and an upper data pad electrode 134 connected, via a third contact hole 168 going through the protective film 152, to the lower data pad electrode 130.

In such a thin film transistor, the upper gate pad electrode 128, the upper data pad electrode 134 and the upper common pad electrode 140 are formed into a third conductive layer along with the pixel electrode 114. The third conductive layer is patterned by a lift-off process of removing a photo-resist pattern used upon patterning of the protective film 152 and the gate insulating film 146. Thus, the patterned third conductive layer makes an interface with the protective film 152. Application of the lift-off process reduces the number of mask processes used during fabrication of the thin film transistor substrate to three. In this case, the pixel hole 164 and the first to third contact holes 166, 170 and 168 are used as a saturation path to thereby enhance the lift-off ability of the photo-resist pattern.

Figure 6B:
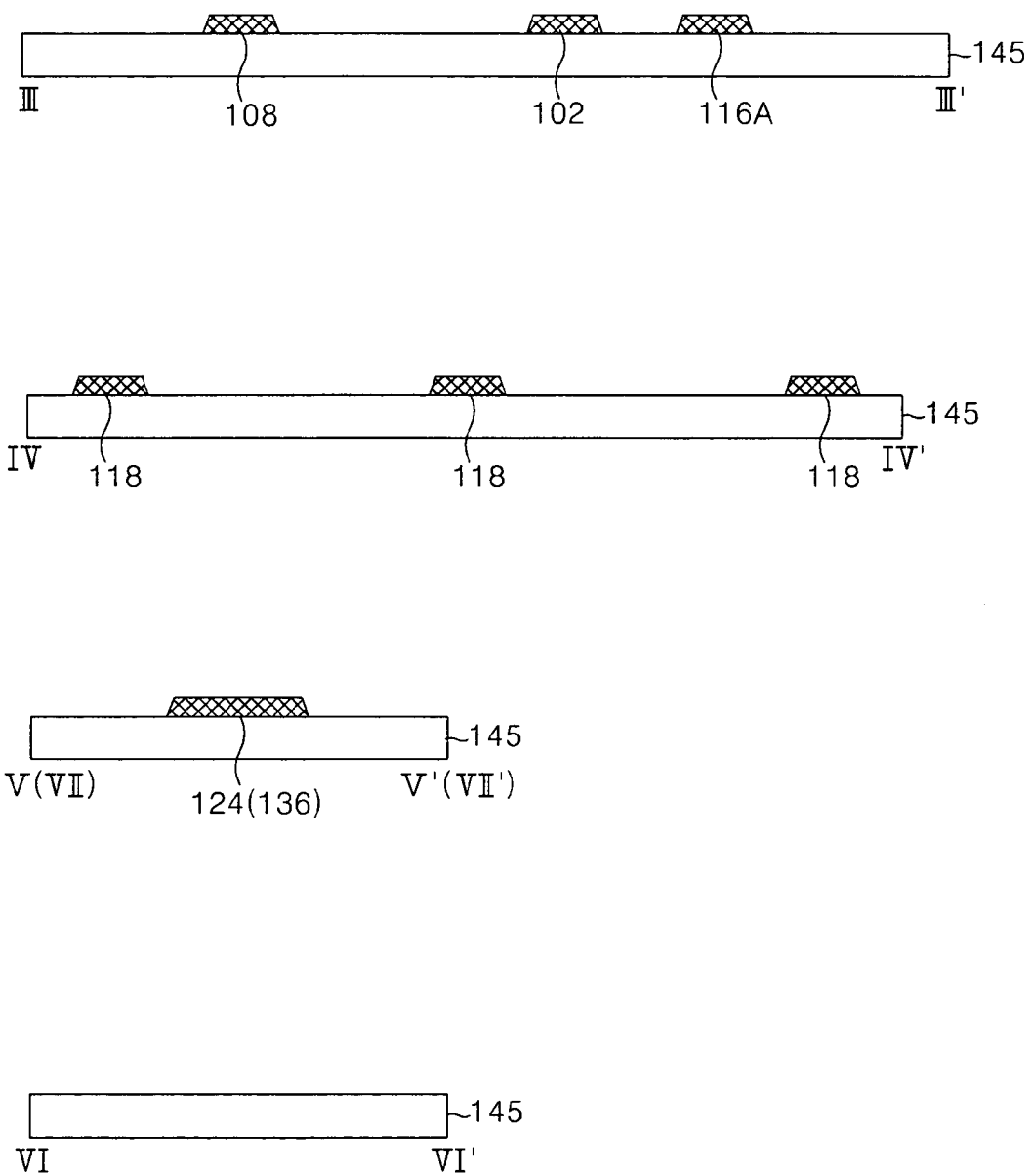

FIG. 6A and FIG. 6B are a plan view and a section view, respectively, of a first mask process in a fabricating method of the above horizontal electric field applying type thin film transistor substrate.

As shown in FIG. 6A and FIG. 6B, a first conductive pattern group including the gate line 102, the gate electrode 108 and the lower gate pad electrode 124, the common line 116, the common electrode 118 and the lower common pad electrode 136 is provided on the lower substrate 145 by the first mask process.

More specifically, a first conductive layer is formed on the upper substrate 145 by a deposition technique such as the sputtering. Then, the first conductive layer is patterned by the photolithography and the etching process using a first mask to thereby form the first conductive pattern group including the gate line 102, the gate electrode 108, the lower gate pad electrode 124, the common line 116, common electrode 118 and the lower common pad electrode 136. The first conductive layer is formed from metals such as Cr, MoW, Cr/Al, Cu, Al(Nd), Mo/Al, Mo/Al(Nd) or Cr/Al(Nd), etc.

Figure 7A:
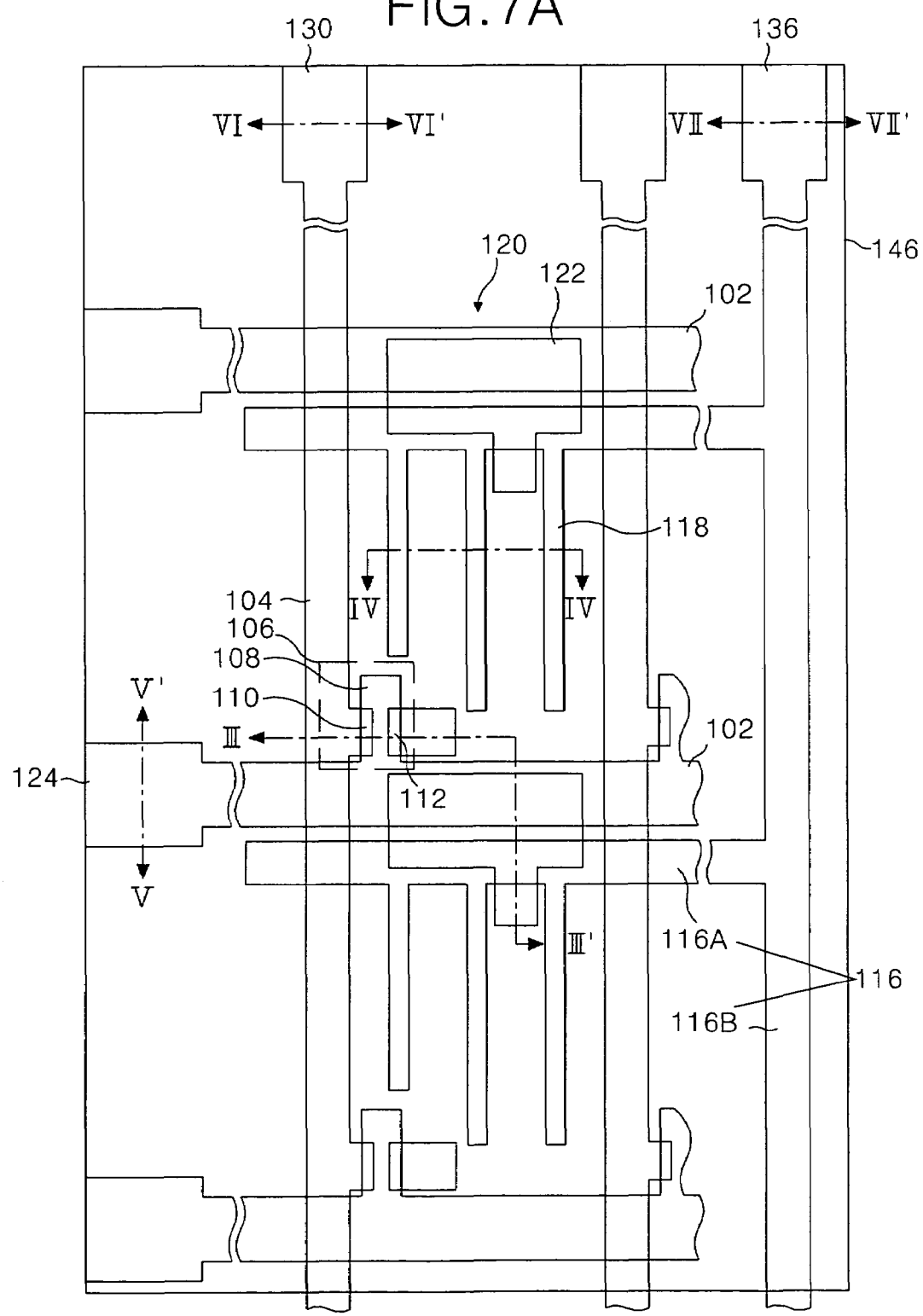
FIG. 7A and FIG. 7B are a plan view and a section view for explaining a second mask process in a fabricating method of the thin film transistor substrate according to the embodiment of the present invention, respectively.
Figure 7B:
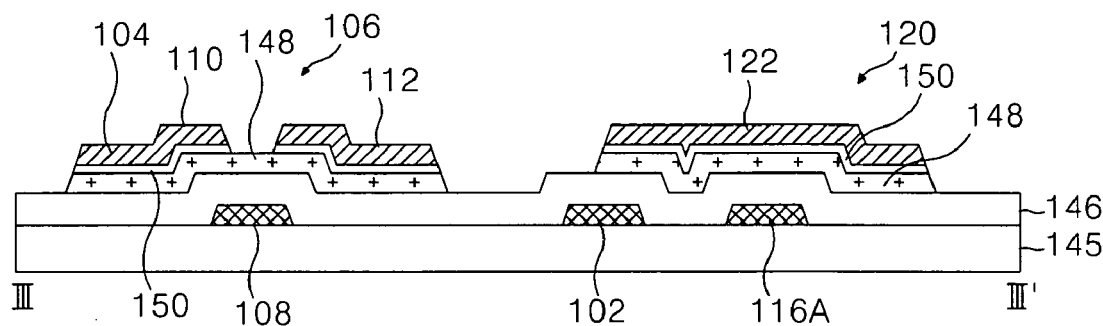
Figure 7B:
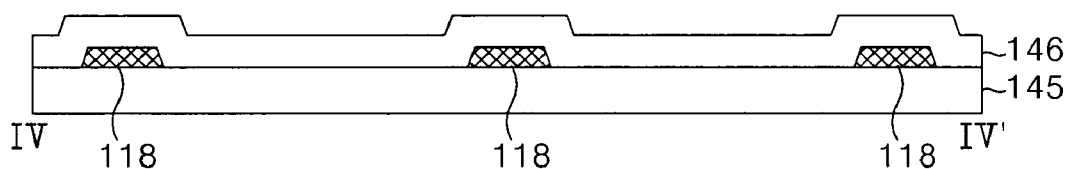
Figure 7B:
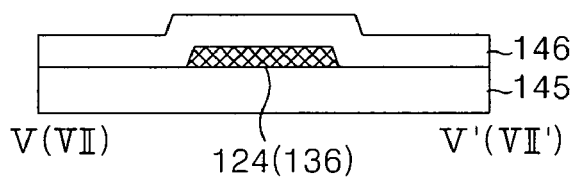
Figure 7B:
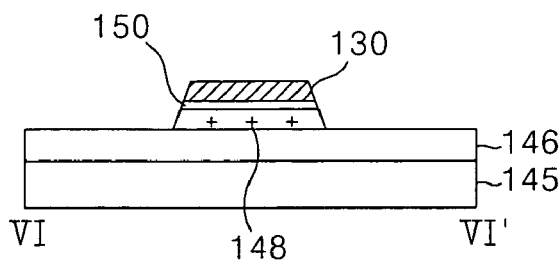

FIG. 7A and FIG. 7B are a plan view and a section view, respectively, of a second mask process in the fabricating method of the above thin film transistor substrate. FIG. 8A to FIG. 8E are section views for specifically explaining the second mask process.

Firstly, the gate insulating film 146 is formed on the lower substrate 145 provided with the gate metal pattern group by deposition techniques such as plasma enhanced chemical vapor deposition (PECVD), sputtering and the like. The gate insulating film 146 is formed from an inorganic insulating material such as silicon nitride ($SiN_x$) or silicon oxide ($SiO_x$).

As shown in FIG. 7A and FIG. 7B, a semiconductor pattern including the active layer 148 and the ohmic contact layer 150 disposed on the gate insulating film 146 and a second conductive pattern group including the data line 104, the source electrode 110, the drain electrode 112, the lower data pad electrode 130 and the upper storage electrode 122 are provided by the second mask process.

Figure 8A:
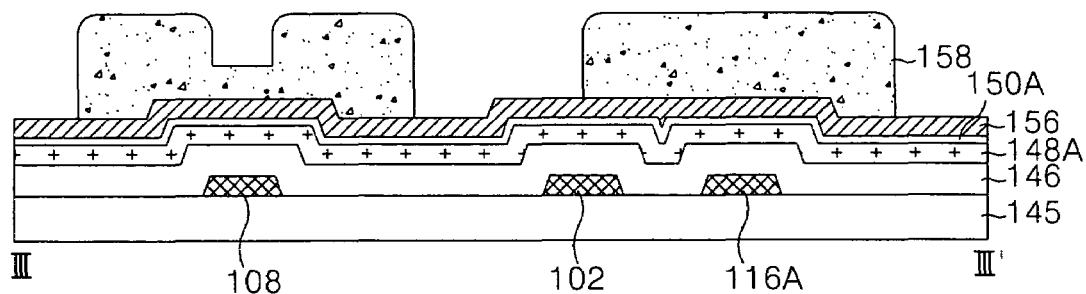
FIG. 8A to FIG. 8D are section views for specifically explaining the second mask process in a fabricating method of the thin film transistor substrate according to the embodiment of the present invention.
Figure 8A:
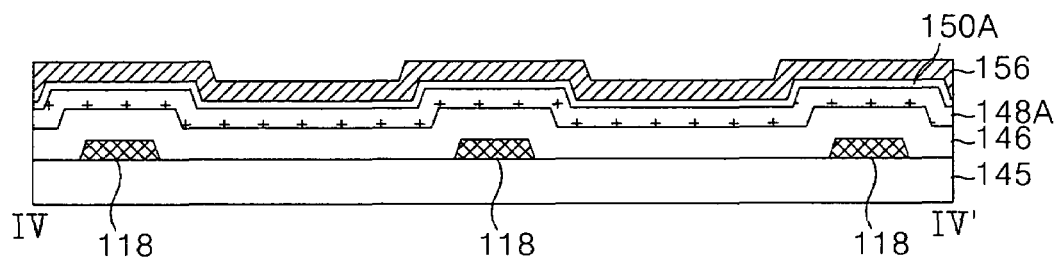
Figure 8A:
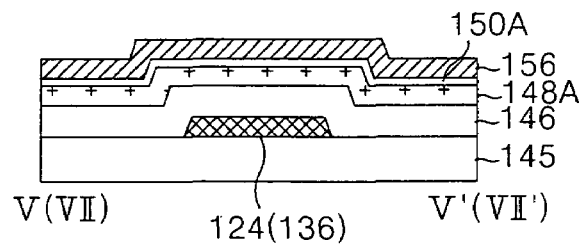
Figure 8A:
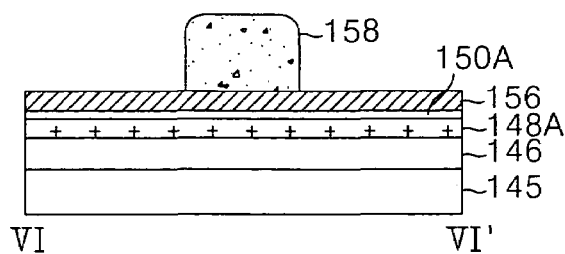

More specifically, as shown in FIG. 8A, an amorphous silicon layer 148A, a $n^+$ amorphous silicon layer 150A and the second conductive layer 156 are sequentially formed on the gate insulating film 146 by deposition techniques such as PECVD and sputtering. Herein, the second conductive layer 156 is formed from metals such as Cr, MoW, Cr/Al, Cu, Al(Nd), Mo/Al, Mo/Al(Nd) or Cr/Al(Nd), etc.

Next, a photo-resist film is entirely coated onto the second conductive layer 156 and then a photo-resist pattern 158 having step coverage as shown in FIG. 8A is formed thereon by the photolithography using a second mask that is a partial-exposure mask. In this case, a partial-exposure mask having a diffractive exposing part (or a semi-transmitting part) in a portion where a channel of the thin film transistor is to be formed is used as the second mask. Thus, the photo-resist pattern 158 corresponding to the diffractive exposing part (or the semi-transmitting part) of the second mask has a lower height than the photo-resist pattern 158 corresponding to a transmitting part (or a shielding part) of the second mask. In other words, the photo-resist pattern 158 at the channel portion has a lower height than the photo-resist pattern 158 at the other source/drain metal pattern portion.

Figure 8B:
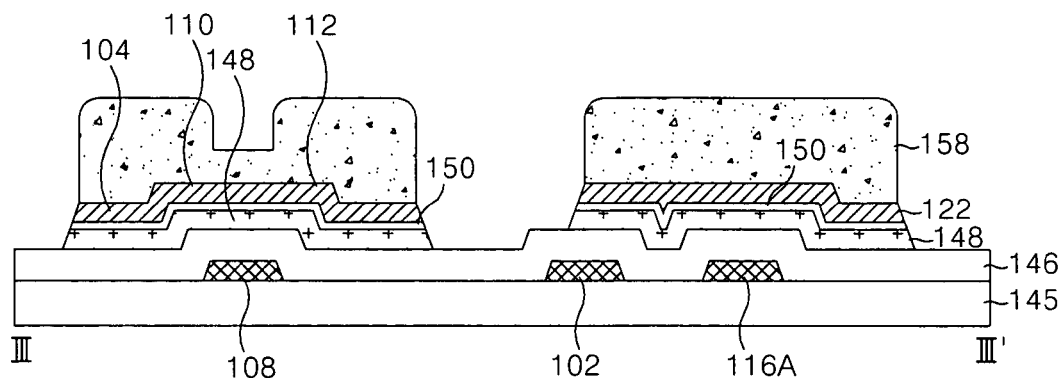
Figure 8B:
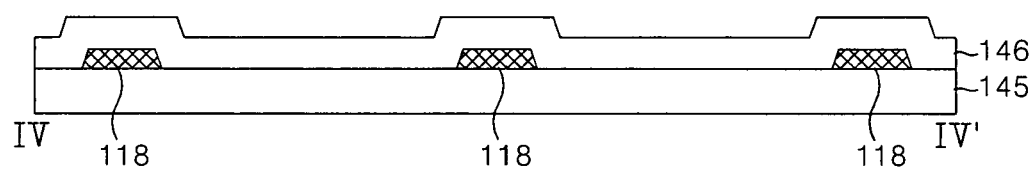
Figure 8B:
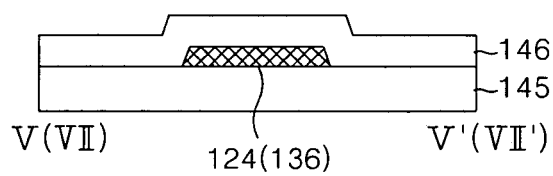
Figure 8B:
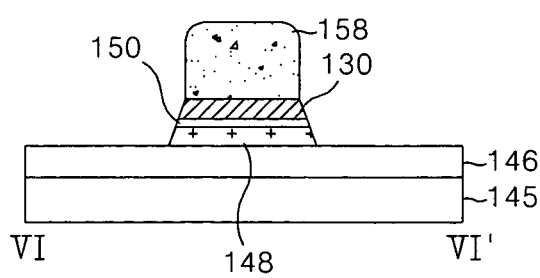

Subsequently, the second conductive layer 156 is patterned by wet etching using the photo-resist pattern 158 to thereby provide the second conductive metal pattern group including the data line 104, the source electrode 110 of the thin film transistor portion, the drain electrode 112 being integral to the source electrode 110, the lower data pad electrode 130 and the upper storage electrode 122 as shown in FIG. 8B. The upper storage electrode 122 overlaps a portion of the gate line 102 and the internal common line 116A. Further, the $n^+$ amorphous silicon layer 150A and the amorphous silicon layer 148A are patterned at the same time by dry etching using the same photo-resist pattern 158 to thereby provide the ohmic contact layer 150 and the active layer 148 having a structure formed along the second conductive pattern group as shown in FIG. 8B.

Figure 8C:
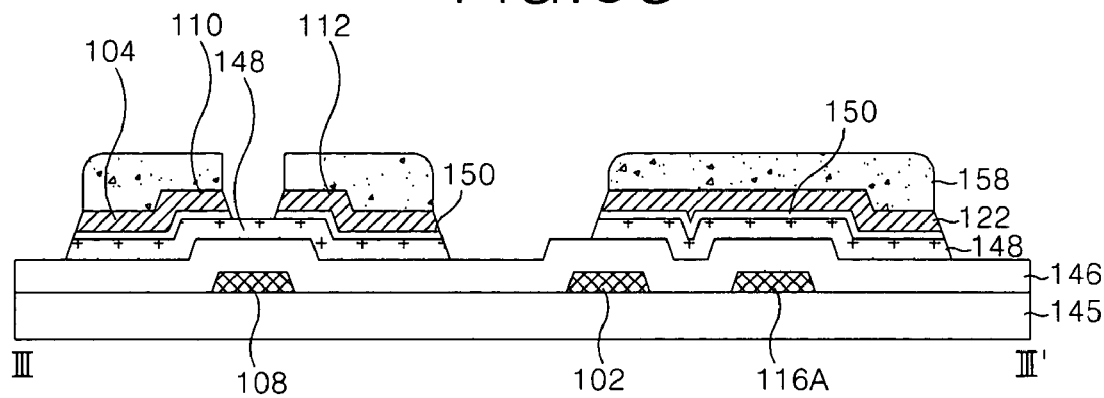
Figure 8C:
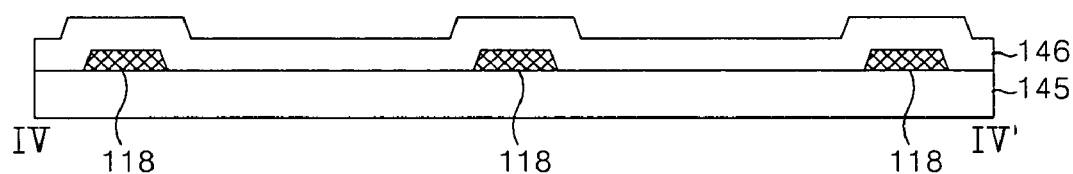
Figure 8C:
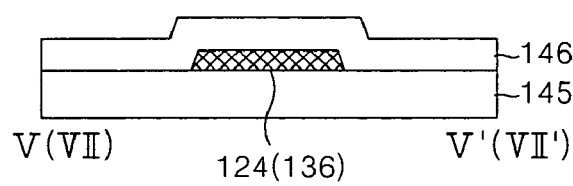
Figure 8C:
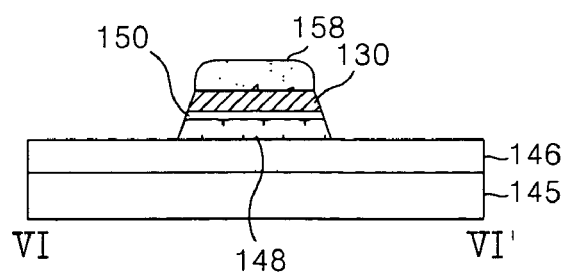

The photo-resist pattern 158 at the channel portion having a relatively low height is removed as shown in FIG. 8C by ashing using an oxygen ($O_2$) plasma. The photo-resist pattern 158 at other second conductive pattern group portion decreases in height, but is not removed entirely.

The second conductive layer and the ohmic contact layer 150 are etched from a portion at which the channel is formed as shown in FIG. 8C by dry etching using the remaining photo-resist pattern 158, thereby disconnecting the source electrode 110 from the drain electrode 112 and exposing the active layer 148.

Figure 8D:
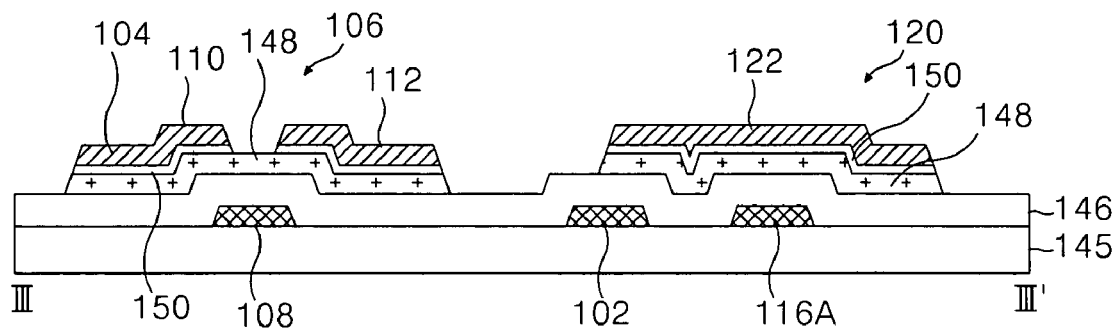
Figure 8D:
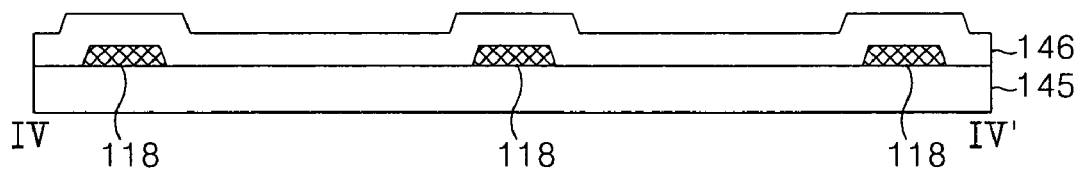
Figure 8D:
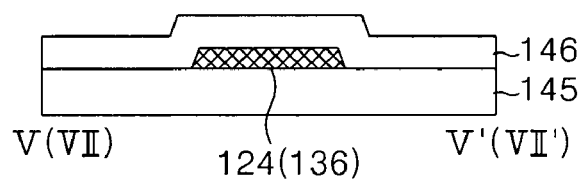
Figure 8D:
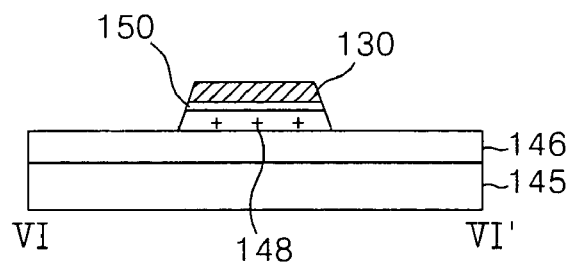

Then, the photo-resist pattern 158 left on the second conductive pattern group portion is entirely removed as shown in FIG. 8D by stripping.

Figure 9A:
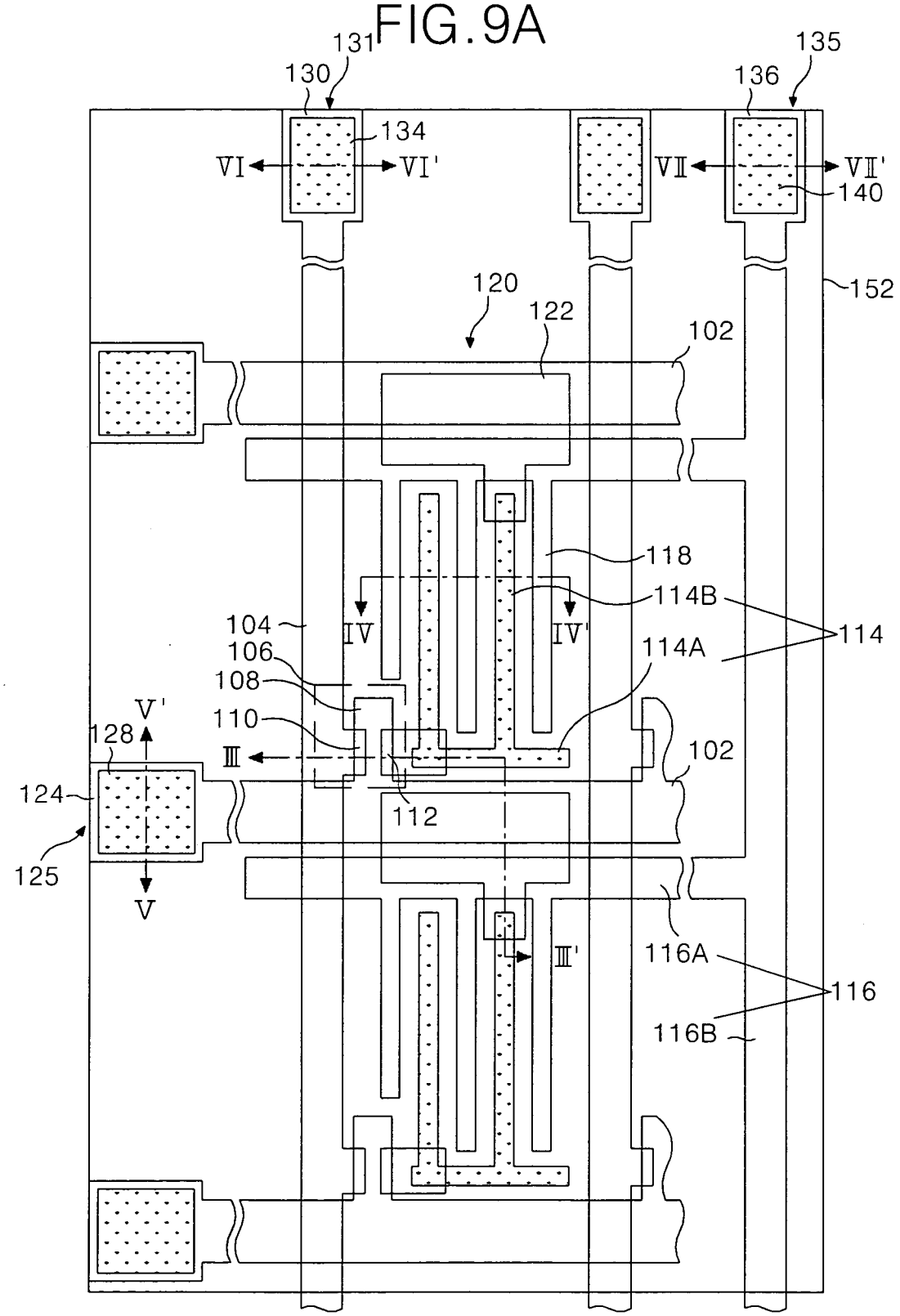
FIG. 9A and FIG. 9B are a plan view and a section view for explaining a third mask process in a fabricating method of the thin film transistor substrate according to the embodiment of the present invention, respectively.
Figure 9B:
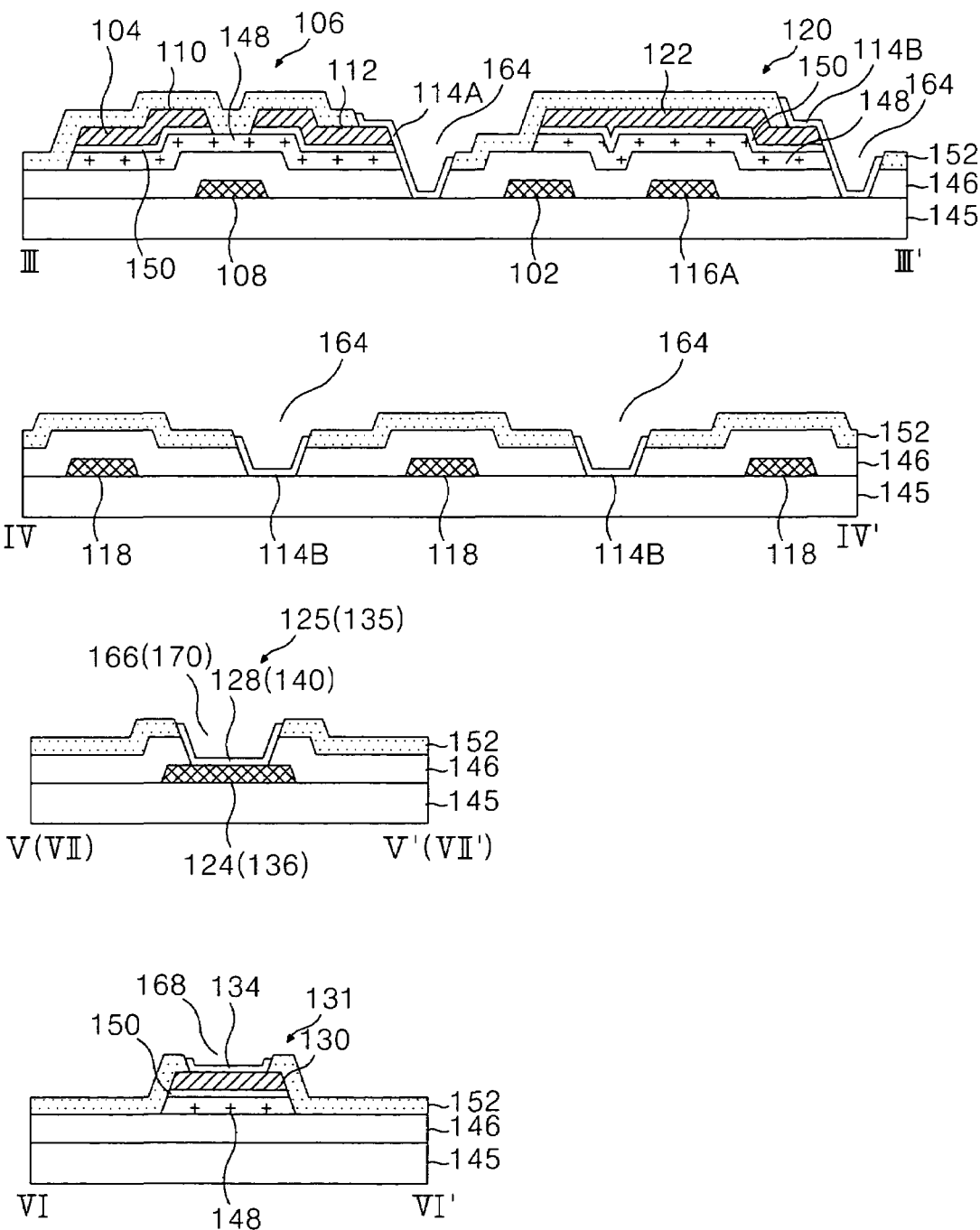

FIG. 9A and FIG. 9B are a plan view and a section view, respectively, of a third mask process in a fabricating method of the above thin film transistor substrate. FIG. 10A to FIG. 10D are section views specifically showing the second mask process.

As shown in FIG. 9A and FIG. 9B, the protective film 152 and the gate insulating film 146 are patterned, and a third conductive pattern group including the pixel electrode 114, the upper gate pad electrode 128, the upper data pad electrode 134 and the upper common pad electrode 140 is formed. Interfaces are created between the third conductive pattern group and the patterned protective film 152 without any overlapped portions.

Figure 10A:
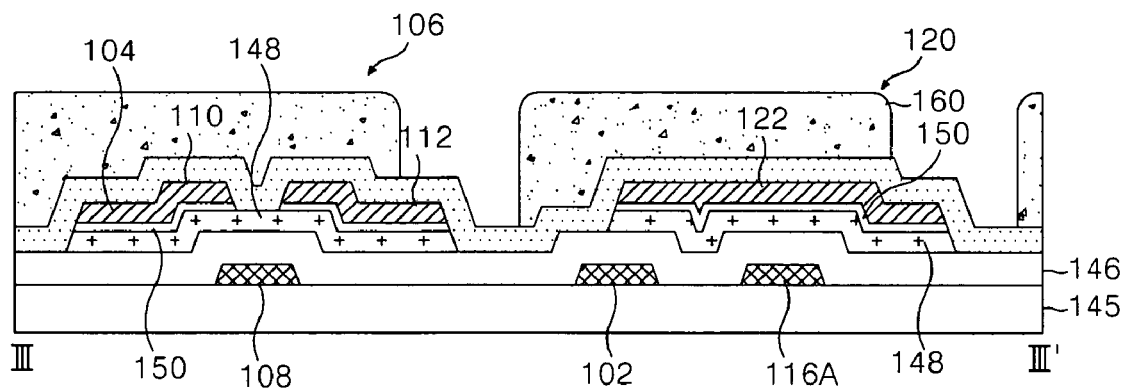
FIG. 10A to FIG. 10D are section views for specifically explaining the third mask process in a fabricating method of the thin film transistor substrate according to the embodiment of the present invention.
Figure 10A:
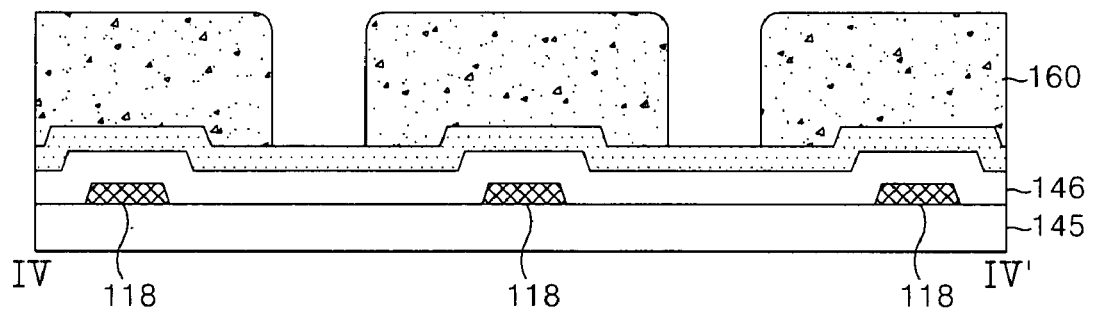
Figure 10A:
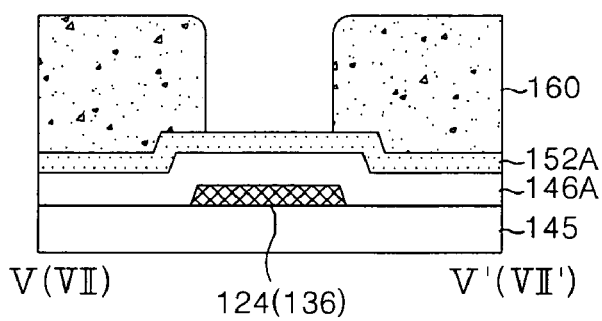
Figure 10A:
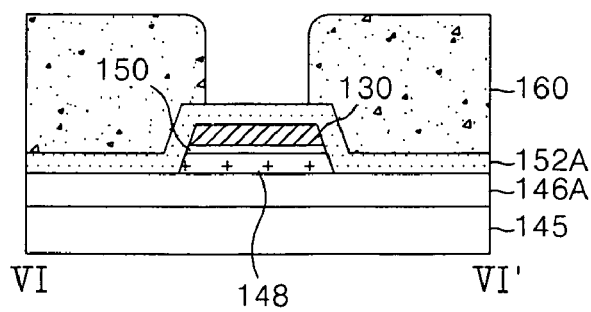

More specifically, the protective film 152 is entirely formed on the gate insulating film 146 provided with the second conductive pattern group as shown in FIG. 10A. The protective film 152 is formed from an inorganic insulating material or an organic insulating material similar to the gate insulating film 146. Further, a photo-resist pattern 160 is formed in portions where the protective film 152 exists as shown in FIG. 10A by photolithography using a third mask.

Figure 10B:
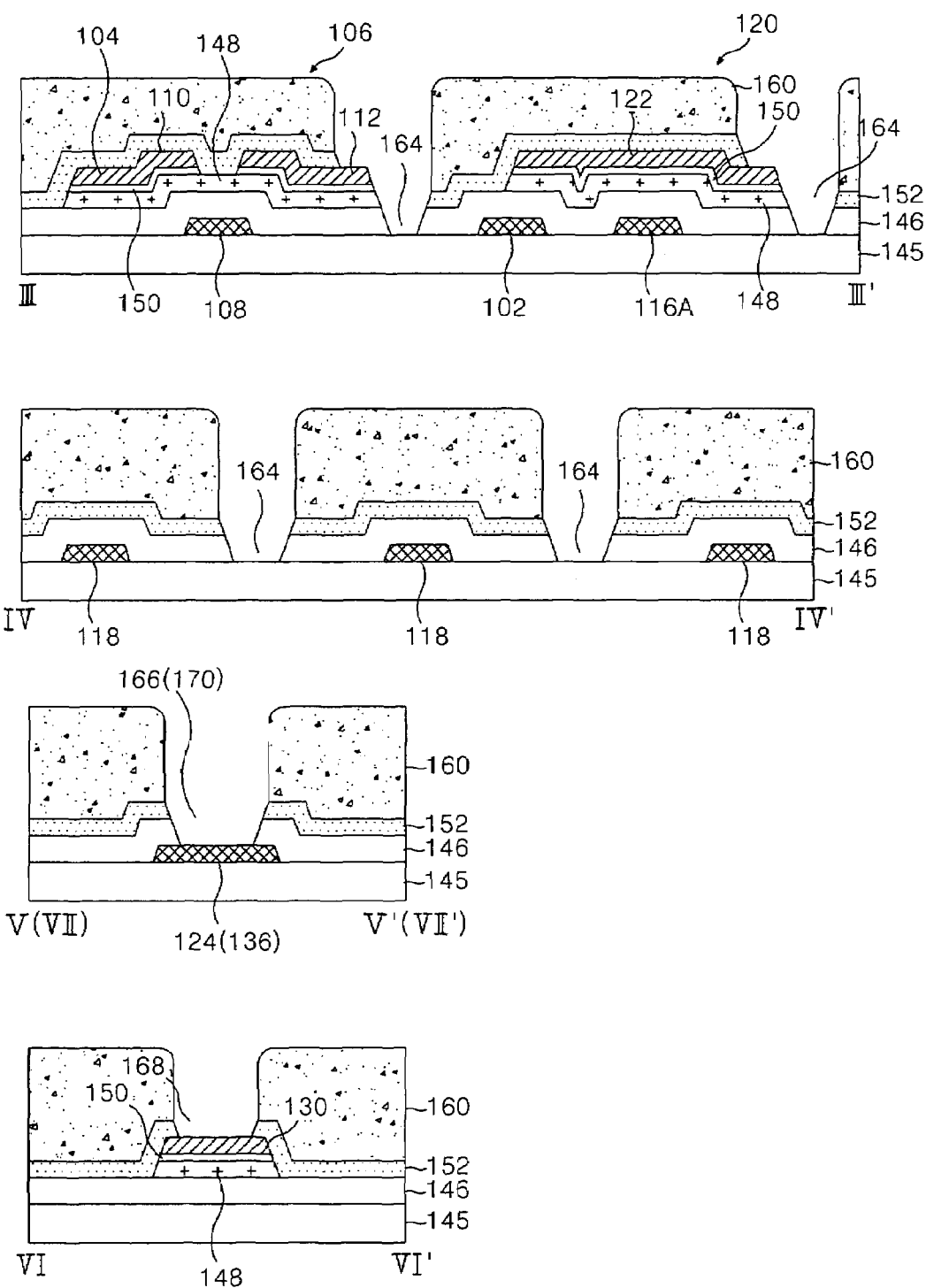

The protective film 152 and the gate insulating film 146 are patterned by dry etching using the photo-resist pattern 160 to thereby form a pixel hole 164 and first to third contact holes 166, 170 and 168 passing through the protective film 152 or the protective film 152 and the gate insulating film 146 as shown in FIG. 10B. The pixel hole 164 exposes a portion of the drain electrode 112 in a portion where the pixel electrode is to be formed and a protruded portion of the upper storage electrode 122. Further, the first contact hole 166 exposes the lower gate pad electrode 124; the second contact hole 170 exposes the lower common pad electrode 136; and the third contact hole 168 exposes the lower data pad electrode 130.

Figure 10C:
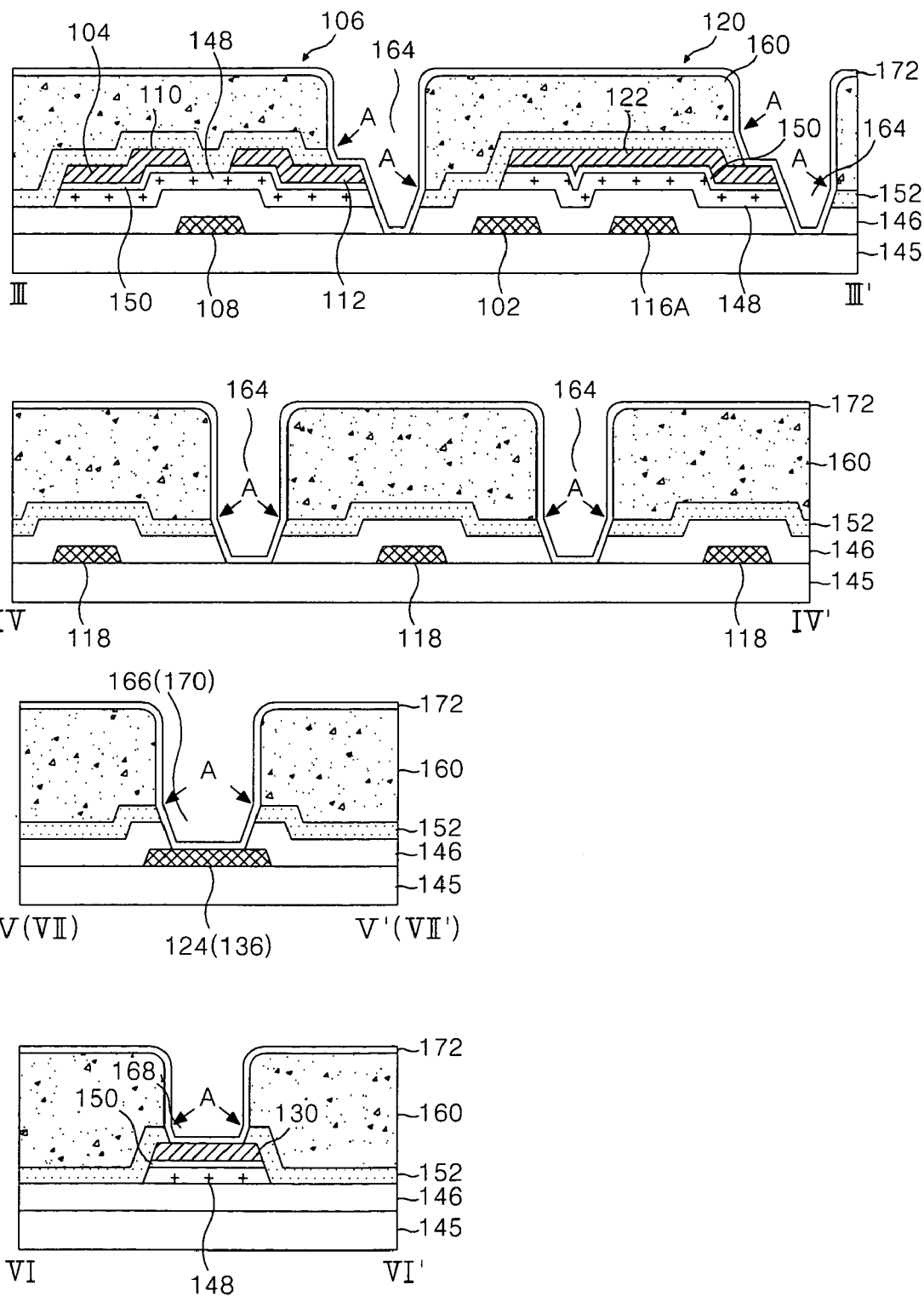

Subsequently, a third conductive layer 172 is entirely formed on the thin film transistor substrate in which the photo-resist pattern 160 exists as shown in FIG. 10C by a deposition technique such as sputtering. The third conductive layer 172 is formed from a transparent conductive film such as indium-tin-oxide (ITO), tin-oxide (TO) or indium-zinc-oxide (IZO), etc. Alternatively, the third conductive film 172 is made from a metal having high corrosion resistance and a high strength such as titanium (Ti) or tungsten (W), etc.

Figure 10D:
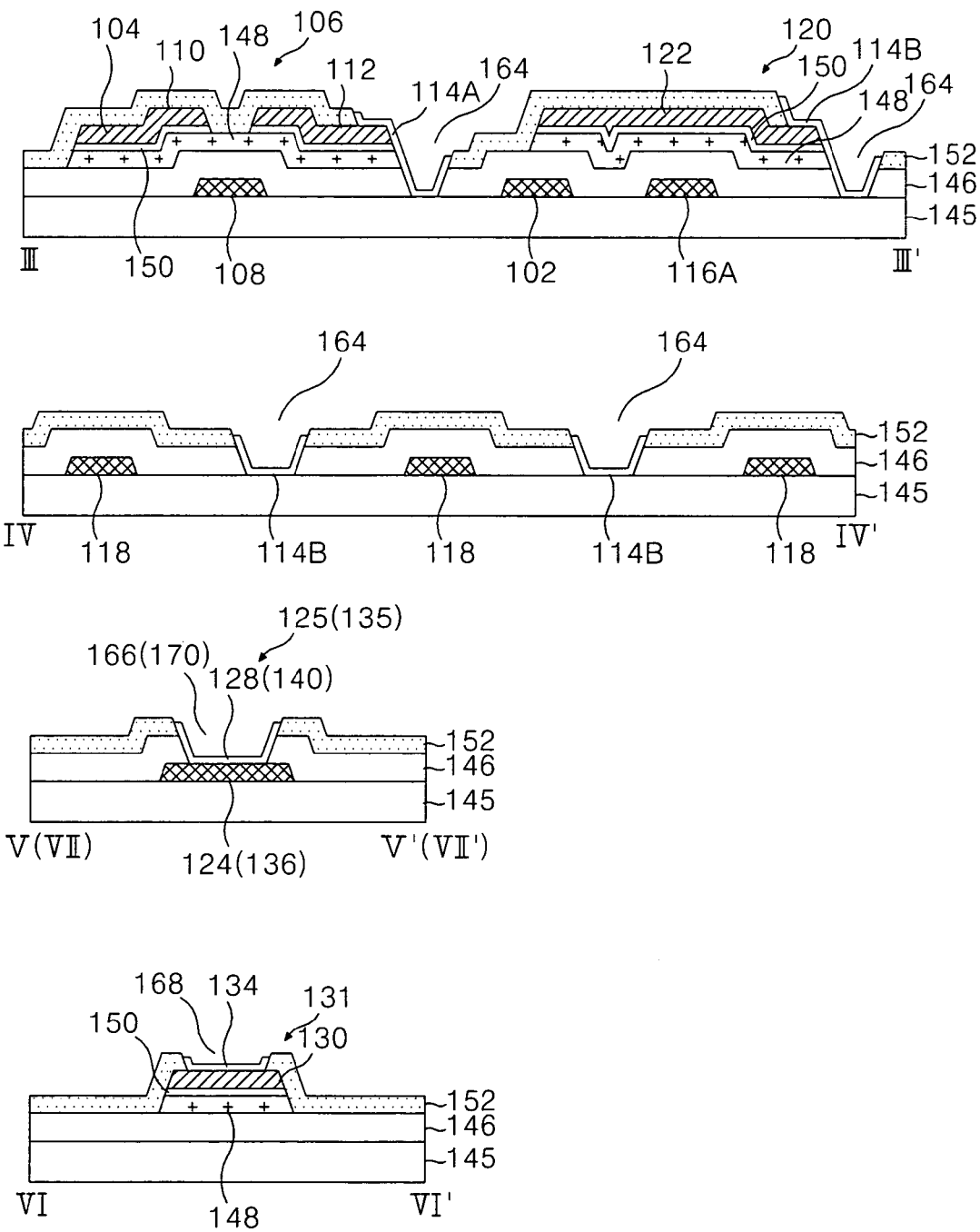

The photo-resist pattern 160, along with the third conductive layer 172, is removed by lift-off to thereby pattern the third conductive layer 172. Thus, the pixel hole 164 and the first to third contact holes 166, 170 and 168 are provided with the pixel electrode 114, the upper gate pad electrode 128, the upper common pad electrode 140 and the upper data pad electrode 134, respectively, as shown in FIG. 10D.

In this case, the pixel hole 164 and the first to third contact holes 162, 166 and 170 are formed in portions in which the photo-resist pattern 160 is not present such that a greater amount of stripper A can penetrate into the interface between the photo-resist pattern 160 and the protective film 152. As a result, the photo-resist pattern 160 covered with the third conductive layer 172 can be easily separated from the protective film 152 by the stripper A. More specifically, penetration occurs because the edge of the photo-resist pattern 160 has a more protruded shape (not shown) than the edge of the protective film 152 at portions where the pixel hole 164 and the first to third contact holes 162, 166 and 170 are provided for the protective film 152 due to over-etching of the protective film 152. The third conductive layer 172 deposited between the edge of the photo-resist pattern 160 and the edge of the protective film is open, or relatively thinly deposited on the protruded edge of the photo-resist pattern 160, which thereby permits the stripper to easily penetrate into the underlying area and effect lift-off.

As mentioned above, unused portions of the third conductive layer 172, along with the photo-resist pattern 160, are removed by lift-off, so that the third conductive pattern group contacts the protective film 152. More specifically, the pixel electrode 114 is provided within the pixel hole 164 to be connected to the exposed drain electrode 112 and the upper storage electrode 122. The upper gate pad electrode 128, the upper common pad electrode 140 and the upper data pad electrode 134 are provided within the corresponding contact holes 166, 170 and 168 to be connected to the lower gate pad electrode 124, the lower common pad electrode 136 and the lower data pad electrode 130, respectively.

As described above, employing a lift-off process to fabricate the third conductive layer reduces the number of mask processes. Accordingly, the thin film transistor substrate is fabricated using three mask processes, simplifying the fabrication process to reduce the manufacturing cost and improve the production yield.

Furthermore, the pixel hole and the first to third contact holes going through the protective film are used as a stripper penetration path, so that lift-off of the photo-resist pattern covered with the third conductive layer can be effectively improved.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A thin film transistor substrate comprising:
   a first conductive layer formed on the substrate, the first conductive layer containing a gate line and a common line arranged in parallel to each other;
   a gate insulating film on the first conductive layer;
   a second conductive layer forming a data line crossing the gate line and the common line with the gate insulating film therebetween to define a pixel area;
   a thin film transistor connected to the gate line and the data line;
   a semiconductor pattern including the thin film transistor and overlapping the data line;
   a common electrode extending from the common line into the pixel area, the common electrode formed by the first conductive layer;
   a protective film covering the data, gate, and common lines and common electrode and the thin film transistor;
   a pixel hole that passes through the protective film and the gate insulating film and exposes a portion of a drain electrode and the substrate in the pixel area; and
   a third conductive layer forming a pixel electrode that is defined by the pixel hole and forms a horizontal electric field along with the common electrode;
   wherein the pixel electrode contacts the gate insulating film on at least two different sides.

2. The substrate according to claim 1, further comprising:
   a lower gate pad electrode extending from the gate line;
   a first contact hole passing through the protective film and the gate insulating film to expose the lower gate pad electrode; and
   a gate pad contacting the protective film within the first contact hole and having an upper gate pad electrode formed by the third conductive layer.

3. The substrate according to claim 2, further comprising:
   a lower common pad electrode extending from the common line;
   a second contact hole passing through the protective film and the gate insulating film to expose the lower common pad electrode; and
   a common pad contacting the protective film within the second contact hole and having an upper common pad electrode formed by the third conductive layer.

4. The substrate according to claim 3, further comprising:
   a lower data pad electrode extending from the data line;
   a third contact hole passing through the protective film to expose the lower data pad electrode; and
   a data pad contacting the protective film within the third contact hole and having an upper data pad electrode formed by the third conductive layer,
   wherein the semiconductor pattern overlaps the lower data pad electrode.

5. The substrate according to claim 1, further comprising:
   a first lower storage electrode connected to the gate line;
   a second lower storage electrode connected to the common line adjacent to the gate line; and
   a storage capacitor connected to the pixel electrode and having an upper storage electrode disposed above the first and second lower storage electrodes with the gate insulating film therebetween and,
   wherein the semiconductor pattern overlaps the upper storage electrode.

6. The substrate according to claim 5, wherein the pixel electrode is connected to a portion of the drain electrode of the thin film transistor exposed by the pixel hole and a portion of the upper storage electrode.

7. The thin film transistor substrate according to claim 1, wherein the protective film further covers a source electrode, the drain electrode, the common electrode, a gate electrode, a lower data pad electrode, the lower gate pad electrode, the lower common pad electrode, and an upper storage electrode.

8. The thin film transistor substrate according to claim 4, wherein the protective film further covers a source electrode, the drain electrode, the common electrode, a gate electrode, the lower data pad electrode, the lower gate pad electrode, the lower common pad electrode, and an upper storage electrode.

9. The thin film transistor substrate according to claim 6, wherein the protective film further covers a source electrode, the drain electrode, the common electrode, a gate electrode, a lower data pad electrode, the lower gate pad electrode, the lower common pad electrode, and the upper storage electrode.

10. The thin film transistor substrate according to claim 1, wherein the pixel electrode contacts the protective film on a first side of the pixel hole and the protective film on a second side of the pixel hole.

11. The thin film transistor substrate according to claim 1, wherein the pixel electrode contacts the drain electrode on a top and side surface.

* * * * *